(12) United States Patent
Howard et al.

(10) Patent No.: US 10,739,290 B2
(45) Date of Patent: Aug. 11, 2020

(54) READ OUT INTEGRATED CIRCUIT (ROIC) FOR RAPID TESTING AND CHARACTERIZATION OF CONDUCTIVITY SKEW OF PHASE-CHANGE MATERIAL (PCM) IN PCM RADIO FREQUENCY (RF) SWITCHES

(71) Applicant: Newport Fab, LLC, Newport Beach, CA (US)

(72) Inventors: David J. Howard, Irvine, CA (US); Gregory P. Slovin, Irvine, CA (US); Nabil El-Hinnawy, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/544,724

(22) Filed: Aug. 19, 2019

(65) Prior Publication Data

US 2020/0057013 A1 Feb. 20, 2020

Related U.S. Application Data

(63) Continuation-in-part of application No. 16/103,490, filed on Aug. 14, 2018, now Pat. No. 10,476,001, and
(Continued)

(51) Int. Cl.
*H01L 45/00* (2006.01)
*G01N 27/04* (2006.01)
*H01L 27/24* (2006.01)

(52) U.S. Cl.
CPC ......... *G01N 27/041* (2013.01); *G01N 27/045* (2013.01); *H01L 27/2463* (2013.01); *H01L 45/06* (2013.01)

(58) Field of Classification Search
None
See application file for complete search history.

(56) References Cited

U.S. PATENT DOCUMENTS 6,894,305 B2 5/2005 Yi
7,522,029 B1 4/2009 Lantz
(Continued)

FOREIGN PATENT DOCUMENTS

WO WO 2016/028362 2/2016

OTHER PUBLICATIONS

"Highly Manufacturable High Density Phase Change Memory of 64Mb and Beyond" by Ahn et al. (Year: 2004).*
(Continued)

*Primary Examiner* — Evren Seven
(74) *Attorney, Agent, or Firm* — Farjami & Farjami LLP

(57) ABSTRACT

A rapid testing read out integrated circuit (ROIC) includes phase-change material (PCM) radio frequency (RF) switches residing on an application specific integrated circuit (ASIC). Each PCM RF switch includes a PCM and a heating element transverse to the PCM. The ASIC is configured to provide amorphizing and crystallizing electrical pulses to a selected PCM RF switch. The ASIC is also configured to generate data for determining and characterizing OFF state conductivity skew and ON state conductivity skew of the PCM in the selected PCM RF switch after the ASIC performs a plurality of OFF/ON cycles. In one implementation, a testing method using the ASIC is disclosed.

20 Claims, 11 Drawing Sheets

Related U.S. Application Data a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018, and a continuation-in-part of application No. 16/161,960, filed on Oct. 16, 2018, now Pat. No. 10,644,235, and a continuation-in-part of application No. 16/274,998, filed on Feb. 13, 2019, now Pat. No. 10,686,128, and a continuation-in-part of application No. 16/276,094, filed on Feb. 14, 2019, now Pat. No. 10,693,061, and a continuation-in-part of application No. 16/543,466, filed on Aug. 16, 2019.

(56) References Cited

U.S. PATENT DOCUMENTS

| | | | |
|---|---|---|---|
| 7,920,414 | B2 | 4/2011 | Lowrey |
| 8,314,983 | B2 | 11/2012 | Frank |
| 8,345,472 | B2 | 1/2013 | Lee |
| 9,257,647 | B2 | 2/2016 | Borodulin |
| 9,362,492 | B2 | 6/2016 | Goktepeli |
| 9,368,720 | B1 | 6/2016 | Moon |
| 9,444,430 | B1 | 9/2016 | Abdo |
| 9,601,545 | B1 | 3/2017 | Tu |
| 9,640,759 | B1 | 5/2017 | Curioni |
| 9,891,112 | B1 | 2/2018 | Abel |
| 9,917,104 | B1 | 3/2018 | Roizin |
| 10,128,243 | B2 | 11/2018 | Yoo |
| 10,164,608 | B2 | 12/2018 | Belot |
| 10,505,106 | B1 * | 12/2019 | Joshi ................... H01L 45/126 |
| 10,529,922 | B1 | 1/2020 | Howard |
| 2005/0127348 | A1 | 6/2005 | Horak |
| 2006/0246712 | A1 | 11/2006 | Kim |
| 2007/0075347 | A1 | 4/2007 | Lai |
| 2007/0247899 | A1 | 10/2007 | Gordon |
| 2008/0142775 | A1 | 6/2008 | Chen |
| 2009/0108247 | A1 | 4/2009 | Takaura |
| 2010/0008127 | A1 | 1/2010 | Muraoka |
| 2010/0084626 | A1 | 4/2010 | Delhougne |
| 2010/0237314 | A1 | 9/2010 | Tsukamoto |
| 2010/0238720 | A1 | 9/2010 | Tio Castro |
| 2010/0246247 | A1 * | 9/2010 | Kim ................... H01L 45/06 365/163 |
| 2011/0002158 | A1 | 1/2011 | Muraoka |
| 2011/0291784 | A1 | 12/2011 | Nakatsuji |
| 2013/0187120 | A1 | 7/2013 | Redaelli |
| 2013/0285000 | A1 | 10/2013 | Arai |
| 2014/0110657 | A1 * | 4/2014 | Redaelli ................ H01L 45/144 257/4 |
| 2014/0191181 | A1 | 7/2014 | Moon |
| 2014/0264230 | A1 | 9/2014 | Borodulin |
| 2014/0339610 | A1 | 11/2014 | Rashed |
| 2015/0048424 | A1 | 2/2015 | Tien |
| 2015/0090949 | A1 | 4/2015 | Chang |
| 2015/0249096 | A1 | 9/2015 | Lupino |
| 2015/0333131 | A1 | 11/2015 | Mojumder |
| 2016/0035973 | A1 | 2/2016 | Raieszadeh |
| 2016/0056373 | A1 | 2/2016 | Goktepeli |
| 2016/0308507 | A1 | 10/2016 | Engelen |
| 2017/0092694 | A1 | 3/2017 | BrightSky |
| 2017/0126205 | A1 | 5/2017 | Lin |
| 2017/0187347 | A1 | 6/2017 | Rinaldi |
| 2017/0243861 | A1 | 8/2017 | Wang |
| 2017/0365427 | A1 | 12/2017 | Borodulin |
| 2018/0005786 | A1 | 1/2018 | Navarro |
| 2018/0122825 | A1 | 5/2018 | Lupino |
| 2018/0194615 | A1 | 7/2018 | Nawaz |
| 2018/0269393 | A1 | 9/2018 | Zhang |
| 2019/0064555 | A1 | 2/2019 | Hosseini |
| 2019/0067572 | A1 | 2/2019 | Tsai |
| 2019/0172657 | A1 | 6/2019 | Zhu |
| 2019/0267214 | A1 | 8/2019 | Liu |

OTHER PUBLICATIONS

"Nanoscale Observations on the Degradation Phenomena of Phase-Change Nonvolatile Memory Devices Using Ge2Sb2Te5" by Yoon (Year: 2007).*

"Performance Comparison of Phase Change Materials and Metal-Insulator Transition Materials for Direct Current and Radio Frequency Switching Applications" by Mahanta et al. (Year: 2018).*

"Thermal Stability of Phase Change Material" by Rathod (Year: 2018).*

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," 2013 *IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

* cited by examiner

READ OUT INTEGRATED CIRCUIT (ROIC) FOR RAPID TESTING AND CHARACTERIZATION OF CONDUCTIVITY SKEW OF PHASE-CHANGE MATERIAL (PCM) IN PCM RADIO FREQUENCY (RF) SWITCHES

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". Furthermore, the present application is a continuation-in-part of and claims the benefit of and priority to application Ser. No. 16/274,998 filed on Feb. 13, 2019, titled "Semiconductor Devices Having Phase-Change Material (PCM) Radio Frequency (RF) Switches and Integrated Passive Devices,". In addition, the present application is a continuation-in-part of and claims the benefit of and priority to application Ser. No. 16/276,094 filed on Feb. 14, 2019, titled "Semiconductor Devices Having Phase-Change Material (PCM) Radio Frequency (RF) Switches and Integrated Active Devices,". Furthermore, the present application is a continuation-in-part of and claims the benefit of and priority to application Ser. No. 16/543,466 filed on Aug. 16, 2019, titled "Read Out Integrated Circuit (ROIC) for Rapid Testing of Functionality of Phase-Change Material (PCM) Radio Frequency (RF) Switches,". The disclosures and contents of all of the above-identified applications are hereby incorporated fully by reference into the present application.

BACKGROUND

Phase-change materials (PCM) are capable of transforming from a crystalline phase to an amorphous phase and vice versa. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds. Repetition of such high temperatures can cause annealing and other thermophysical hysteresis effects which detrimentally change the conductivity of PCM over time. Conductivity skew (i.e. undesirable change in resistance) of PCM due to repeated OFF/ON cycling can result in a PCM RF switch having higher insertion losses in the ON state. Thus, conductivity skew of PCM is a figure of merit that can determine the marketability of the RF switch and its suitability for a given application.

Accurately quantifying conductivity skew of PCM can be problematic. Computer simulations cannot accurately predict the conductivity of PCM over an entire lifetime. It might be necessary to perform more than one million OFF/ON cycles before PCM exhibits any detectable conductivity skew. Further, it might be necessary to detect conductivity skew in thousands of PCM RF switches in order to achieve statistically significant results regarding the degree of conductivity skew for a given PCM RF switch design.

Conventional techniques of testing RF switches, for example, by connecting external probes of an automated test equipment (ATE) to one RF switch at a time, have significant time delays that render generating large sets of test data impractical. When resorting to conventional testing in the context of PCM RF switches, time delays associated with generating the required temperatures to crystallize and amorphize the PCM in each individual RF switch additionally impede generating large sets of test data. Conventional means of testing can also introduce problems associated with the impedance of cables or wirebonds, and reduce the accuracy of test data.

Thus, there is need in the art to generate large sets of data for determining and characterizing conductivity skew of PCM in PCM RF switches accurately and rapidly.

SUMMARY

The present disclosure is directed to a read out integrated circuit (ROIC) for rapid testing and characterization of conductivity skew of phase-change material (PCM) in PCM radio frequency (RF) switches, substantially as shown in and/or described in connection with at least one of the figures, and as set forth in the claims.

DETAILED DESCRIPTION

Figure 1:
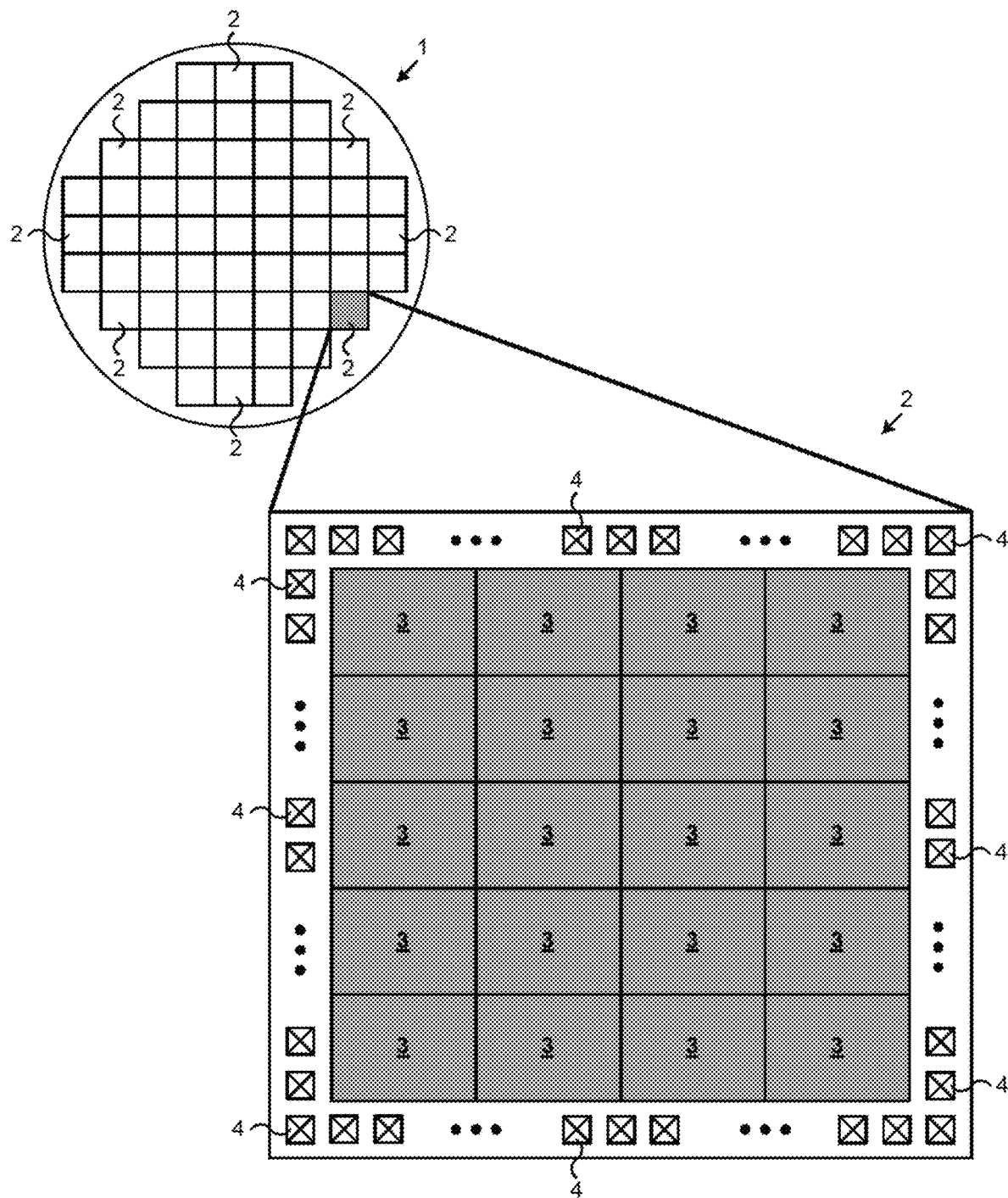
FIG. 1 illustrates a layout of a wafer and an expanded layout of a rapid testing read out integrated circuit (ROIC) according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a layout of a wafer and an expanded layout of a rapid testing read out integrated circuit (ROIC) according to one implementation of the present application. As shown in FIG. 1, wafer 1 includes multiple ROICs 2. Each of the ROICs 2 has a corresponding die on wafer 1. In one implementation, wafer 1 is a silicon wafer having a diameter of approximately two hundred millimeters (200 mm). In the present implementation, fifty seven (57) ROICs 2 are situated on wafer 1. In various implementations, wafer 1 can include greater or fewer ROICs 2. In one implementation, each of ROICs 2 has dimensions of approximately twenty millimeters by approximately twenty millimeters (20 mm×20 mm).

As shown in the expanded layout in FIG. 1, each of ROICs 2 includes designs 3 and contact pads 4. As described below, each of designs 3 includes an array of phase-change material (PCM) radio frequency (RF) switches (not shown in FIG. 1) to be tested. In the present implementation, each of ROICs 2 contains twenty designs 3. In various implementations, each of ROICs 2 can include greater or fewer designs 3. Different designs 3 can include different PCM RF switches. However, in one implementation, all designs 3 contain identical PCM RF switches. In one implementation, each designs 3 has dimensions of approximately four millimeters by approximately five millimeters (4 mm×5 mm).

Contact pads 4 provide contact points for external probes (not shown in FIG. 1). As described below, programming signals and test signals for testing PCM RF switches in designs 3 are generated in ROICs 2. Thus, contact pads 4 are generally not used for receiving programming signals and test signals from external probes. Rather, contact pads 4 are generally used to read out test data generated by ROICs 2. External probes can be coupled to an automatic test equipment (ATE; not shown in FIG. 1) for receiving and analyzing test data generated by ROICs 2. Contact pads 4 can also be used for other functions, such as providing power and/or ground to ROICs 2, and providing bi-directional communications between ROICs 2 and the ATE. In the present implementation, contact pads 4 have an approximately square shape, line the edges of each of ROICs 2, and surround designs 3. In one implementation, each of contact pads 4 has dimensions of approximately one hundred fifty microns by approximately one hundred fifty microns (150 µm×150 µm). In various implementations, contact pads 4 can have any other shapes and/or arrangements in ROICs 2.

Figure 2:
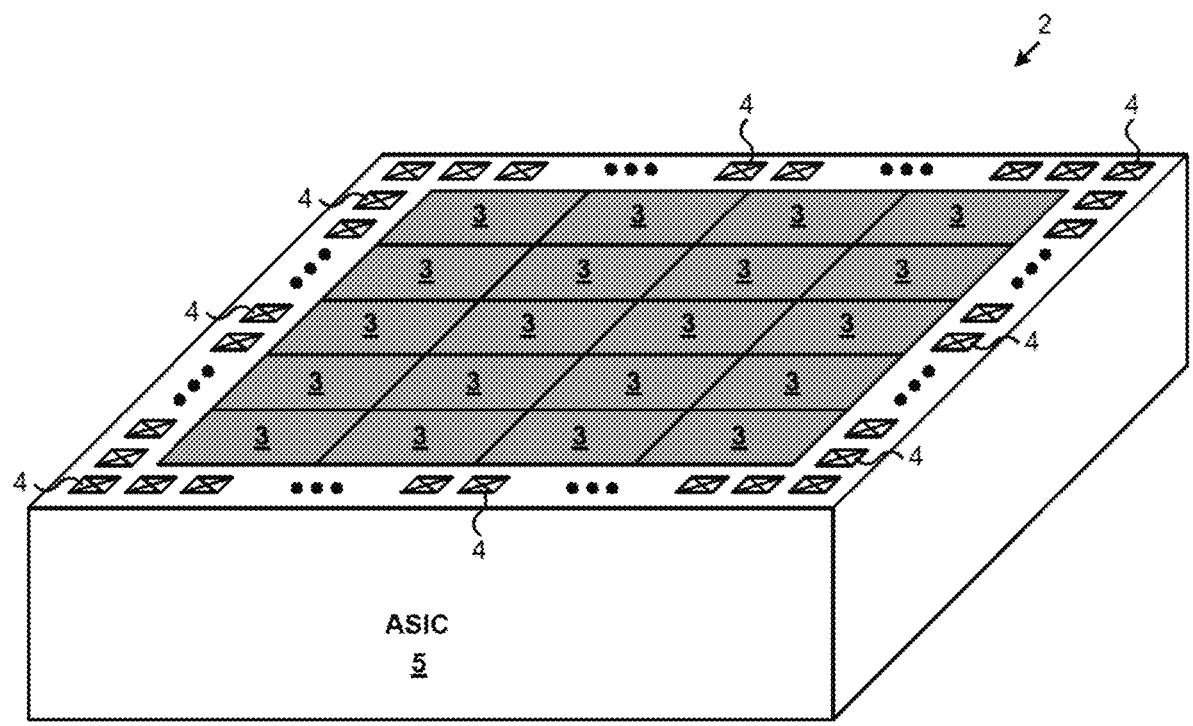
FIG. 2 illustrates a perspective view of a portion of a rapid testing ROIC according to one implementation of the present application.

FIG. 2 illustrates a perspective view of a portion of a rapid testing ROIC according to one implementation of the present application. ROIC 2 in FIG. 2 generally corresponds to any of ROICs 2 in FIG. 1. As shown in FIG. 2, ROIC 2 includes designs 3, contact pads 4, and application specific integrated circuit (ASIC) 5. Contact pads 4 and PCM RF switches in designs 3 reside on ASIC 5. As described below, circuitry for testing the PCM RF switches resides within ASIC 5. In particular, ASIC 5 includes circuitry for providing programming signals and test signals for testing PCM RF switches in designs 3. ASIC 5 also generates test data which can be read out through contact pads 4.

Figure 3:
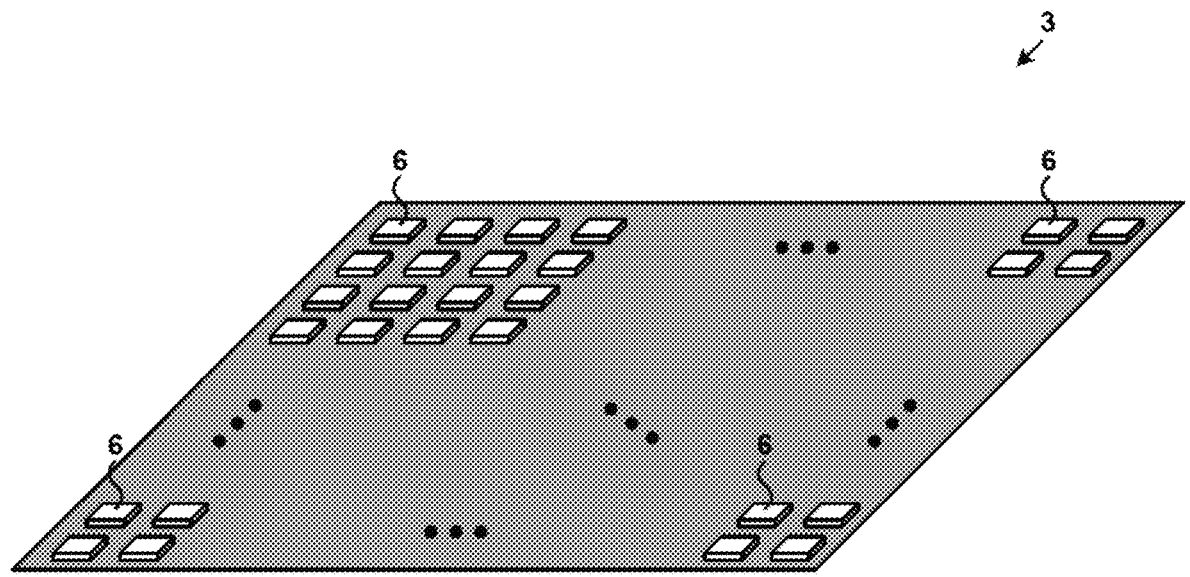
FIG. 3 illustrates a perspective view of a portion of an array of phase-change material (PCM) radio frequency (RF) switches according to one implementation of the present application.

FIG. 3 illustrates a perspective view of a portion of an array of phase-change material (PCM) radio frequency (RF) switches according to one implementation of the present application. Design 3 includes the array of PCM RF switches 6. Additional details regarding PCM RF switches 6 are described below. Design 3 in FIG. 3 generally corresponds to any of designs 3 in FIG. 2. Although design 3 is connected to test circuitry within an ASIC, such as ASIC 5 in FIG. 2, the connectors, test circuitry, and ASIC are not shown in FIG. 3.

In one implementation, design 3 includes one thousand (1,000) PCM RF switches 6. In this implementation, each of the twenty designs 3 in FIG. 2 can include one thousand PCM RF switches 6, and ROIC 2 in FIG. 2 can have a total of twenty thousand (20,000) PCM RF switches 6. Different designs 3 can include different PCM RF switches. However, in one implementation, all designs 3 contain identical PCM RF switches. Each of the fifty seven (57) ROICs 2 in wafer 1 in FIG. 1 can include twenty thousand (20,000) PCM RF switches 6, and wafer 1 in FIG. 1 can have a total of one million one hundred forty thousand (1,140,000) PCM RF switches 6. In various implementations, design 3 can include more of fewer PCM RF switches 6. In various implementations, PCM RF switches 6 can be arranged in manners other than an array.

Testing large numbers of PCM RF switches 6 using conventional means, for example, by connecting external probes of an ATE to one individual PCM RF switch at a time, would be impractical. In order to achieve statistically significant results regarding the reliability of a PCM RF switch, it might be necessary to test the PCM RF switch for more than one million OFF/ON cycles. Due to time delays associated with switching between OFF/ON states and time delays associated with generating test data, it could take a day or longer to complete more than one million OFF/ON cycles for a single PCM RF switch. Thus, testing all twenty thousand (20,000) PCM RF switches 6 on a single ROIC 2 would take an impractically long time. Also, as described below, PCM RF switches 6 can have four terminals. External probes and corresponding contact pads are generally significantly larger than PCM RF switches 6. As such, providing contact pads for each terminal of the twenty thousand (20,000) PCM RF switches 6 on ROIC 2 would also be impractical.

Figure 4:
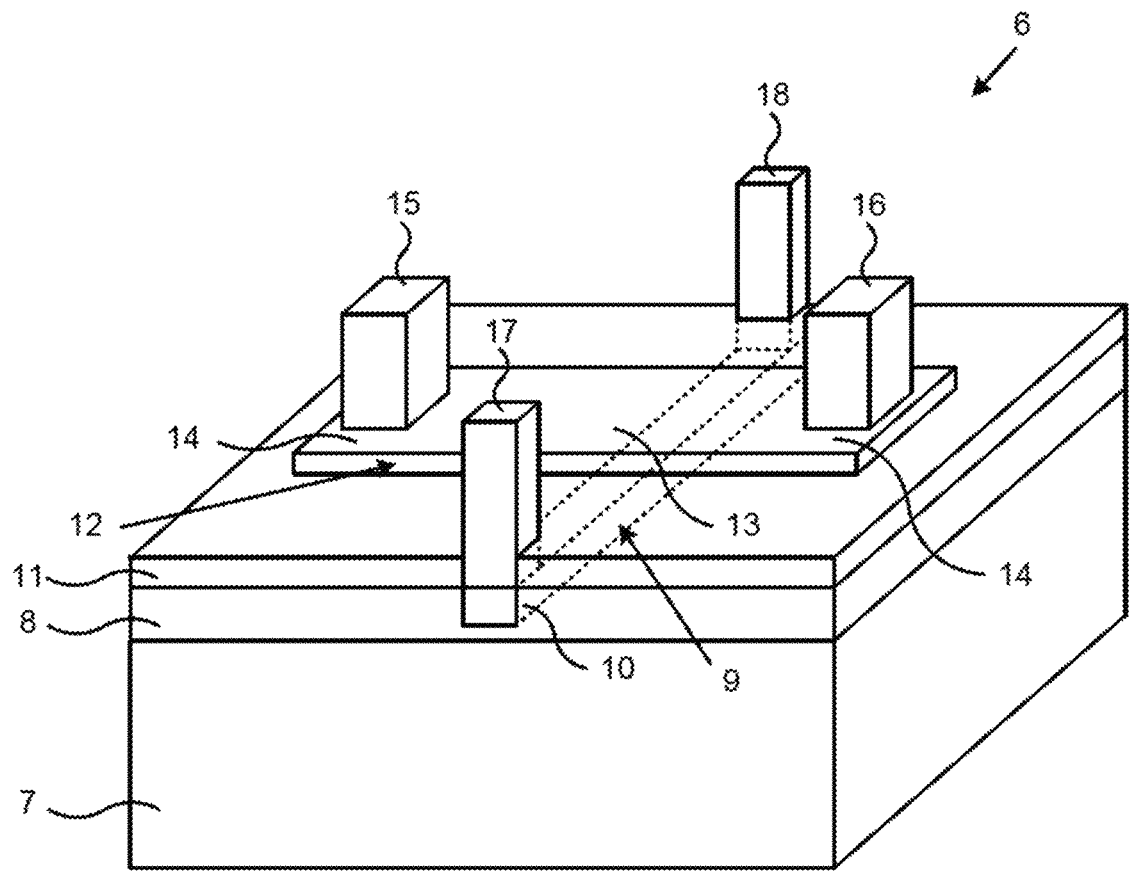
FIG. 4 illustrates a perspective view of a portion of PCM RF switch according to one implementation of the present application.

FIG. 4 illustrates a perspective view of a portion of PCM RF switch according to one implementation of the present application. PCM RF switch 6 in FIG. 4 generally corresponds to any of PCM RF switches 6 in FIG. 3. As shown in FIG. 4, PCM RF switch 6 includes substrate 7, lower dielectric 8, heating element 9 having terminal segments 10, thermally conductive and electrically insulating material 11, PCM 12 having active segment 13 and passive segments 14, PCM contacts 15 and 16, and heater contacts 17 and 18. For purposes of illustration, the perspective view in FIG. 4 shows selected structures of PCM RF switch 6. PCM RF switch 6 may include other structures not shown in FIG. 4.

Substrate 7 is situated under lower dielectric 8. In one implementation, substrate 7 is an insulator, such as silicon oxide ($SiO_2$). In various implementations, substrate 7 is a silicon (Si), silicon-on-insulator (SOI), sapphire, complementary metal-oxide-semiconductor (CMOS), bipolar CMOS (BiCMOS), or group III-V substrate. In various implementations, substrate 7 includes a heat spreader or substrate 7 itself performs as a heat spreader. Substrate 7 can have additional layers (not shown in FIG. 4). In one implementation, substrate 7 can comprise a plurality of interconnect metal levels and interlayer dielectric layers. Substrate 7 can also comprise a plurality of devices, such as integrated passive devices (not shown in FIG. 4).

Lower dielectric 8 in PCM RF switch 6 is situated above substrate 7 and below thermally conductive and electrically insulating material 11. As shown in FIG. 4, lower dielectric 8 is also adjacent to sides of heating element 9. Lower dielectric 8 extends along the width of PCM RF switch 6, and is also coplanar with the top of heating element 9. Because PCM RF switch 6 includes lower dielectric 8 on the sides of heating element 9, less heat transfers horizontally (i.e., from the sides) and more heat dissipates vertically, from heating element 9 toward active segment 13 of PCM 12. In various implementations, lower dielectric 8 can have a relative width and/or a relative thickness greater or less than shown in FIG. 4. Lower dielectric 8 can comprise any material with thermal conductivity less than that of thermally conductive and electrically insulating material 11.

Heating element 9 in PCM RF switch 6 is situated in lower dielectric 8. Heating element 9 also approximately defines active segment 13 of PCM 12. Heating element 9 generates a crystallizing heat pulse or an amorphizing heat pulse for transforming active segment 13 of PCM 12. Heating element 9 can comprise any material capable of Joule heating. Heating element 9 can be connected to electrodes of a pulser (not shown in FIG. 4) that generates voltage or current pulses. Preferably, heating element 9 comprises a material that exhibits minimal or substantially no electromigration, thermal stress migration, and/or agglomeration. In various implementations, heating element 9 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 9 comprises tungsten lined with titanium and titanium nitride.

Thermally conductive and electrically insulating material 11 in PCM RF switch 6 is situated on top of heating element 9 and lower dielectric layer 8, and under PCM 12 and, in particular, under active segment 13 of PCM 12. Thermally conductive and electrically insulating material 11 ensures efficient heat transfer from heating element 9 toward active segment 13 of PCM 12, while electrically insulating heating element 9 from PCM contacts 15 and 16, PCM 12, and other neighboring structures.

Thermally conductive and electrically insulating material 11 can comprise any material with high thermal conductivity and high electrical resistivity. In various implementations, thermally conductive and electrically insulating material 11 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 11 can be a nugget that does not extend along the width of PCM RF switch 6. For example, thermally conductive and electrically insulating material 11 can be a nugget approximately aligned with heating element 9.

PCM 12 in PCM RF switch 6 is situated on top of thermally conductive and electrically insulating material 11. PCM RF switch 6 utilizes PCM 12 to transfer input RF signals in an ON state and to block input RF signals in an OFF state. PCM 12 includes active segment 13 and passive segments 14. Active segment 13 of PCM 12 is approximately defined by heating element 9. Passive segments 14 of PCM 12 extend outward and are transverse to heating element 9, and are situated approximately under PCM contacts 15 and 16. As used herein. "active segment" refers to a segment of PCM that transforms between crystalline and amorphous phases, for example, in response to a crystallizing or an amorphizing heat pulse generated by heating element 9, whereas "passive segment" refers to a segment of PCM that does not make such transformation and maintains a crystalline phase (i.e., maintains a conductive state).

With proper heat pulses and heat dissipation, active segment 13 of PCM 12 can transform between amorphous and crystalline phases, allowing PCM RF switch 6 to switch between OFF and ON states respectively. Active segment 13 of PCM 12 must be heated and rapidly quenched in order for PCM RF switch 6 to switch states. If active segment 13 of PCM 12 does not quench rapidly enough, it will not transform, and PCM RF switch 6 will fail to switch states. How rapidly active segment 13 of PCM 12 must be quenched depends on the material, volume, and temperature of PCM 12. In one implementation, the quench time window can be approximately one hundred nanoseconds (100 ns) or greater or less.

PCM 12 can comprise germanium telluride ($Ge_XTe_Y$), germanium antimony telluride ($Ge_XSb_Y Te_Z$), germanium selenide ($Ge_XSe_Y$), or any other chalcogenide. In various implementations, PCM 12 can be germanium telluride having from forty percent to sixty percent germanium by composition (i.e., $Ge_XTe_Y$, where $0.4 \leq X \leq 0.6$ and $Y=1-X$). The material for PCM 12 can be chosen based upon ON state resistivity, OFF state electric field breakdown voltage, crystallization temperature, melting temperature, or other considerations. It is noted that in FIG. 4, heating element 9 is transverse to PCM 12. Heating element 9 is illustrated with dashed lines as seen through various structures of PCM RF switch 6. Current flowing in heating element 9 flows approximately under active segment 13 of PCM 12.

PCM contacts 15 and 16 in PCM RF switch 6 are connected to passive segments 14 of PCM 12. Similarly, heater contacts 17 and 18 are connected to terminal segments 10 of heating element 9. PCM contacts 15 and 16 provide RF signals to and from PCM 12. Heater contacts 17 and 18 provide power to heating element 9 for generating a crystallizing heat pulse or an amorphizing heat pulse. In various implementations, PCM contacts 15 and 16 and heater contacts 17 and 18 can comprise tungsten (W), copper (Cu), or aluminum (Al). PCM contacts 15 and 16 and heater contacts 17 and 18 can extend through various dielectric layers (not shown in FIG. 4). In one implementation, in order to ensure uniform contact between PCM 12 and PCM contacts 15 and 16, PCM contacts 15 and 16 can extend through a contact uniformity support layer (not shown in FIG. 4) situated on top of PCM 12, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

Figure 5A:
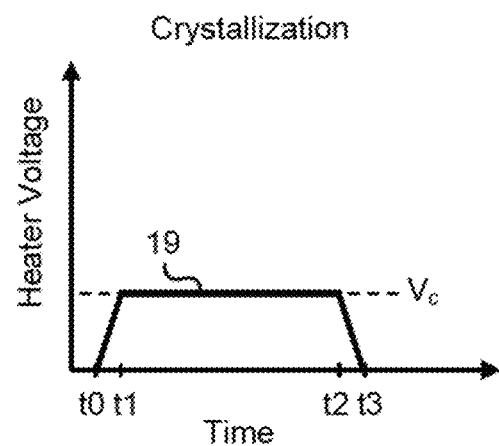
FIG. 5A illustrates an exemplary graph of heater voltage versus time according to one implementation of the present application.

FIG. 5A illustrates an exemplary graph of heater voltage versus time according to one implementation of the present application. The heater voltage-time graph in FIG. 5A represents the voltage at a heater contact of a heating element, such as heater contact 18 of heating element 9 in FIG. 4, plotted over time when crystallizing electrical pulse 19 is applied to the heating element. As shown in FIG. 5A, from time t0 to time t1, crystallizing electrical pulse 19 rises from zero voltage to approximately crystallization voltage $V_C$. From time t1 to time t2, crystallizing electrical pulse 19 remains approximately at crystallization voltage $V_C$. From time t2 to time t3, crystallizing electrical pulse 19 falls from approximately crystallization voltage $V_C$ to zero voltage.

An electrical pulse that holds the heating element at or above crystallization voltage $V_C$ for a sufficient amount of time will cause the heating element to generate a crystallizing heat pulse that will transform a PCM into a crystalline phase. Accordingly, such an electrical pulse is referred to as a "crystallizing electrical pulse" in the present application. Crystallization voltage $V_C$ and the amount of time needed to transform the PCM into a crystalline phase depends on various factors, such the material, dimensions, temperature, and thermal conductivity of the heating element, the PCM, and their neighboring structures. In one implementation, crystallization voltage $V_C$ can be approximately six volts (6 V). In one implementation, the time required can range from approximately one hundred nanoseconds to two thousand nanoseconds (100 ns-2,000 ns) or greater or less. In the present exemplary implementation, the duration from time t1 to time t2 in FIG. 5A can be approximately one thousand nanoseconds (1.000 ns). The duration from time t0 to time t1 and the duration from time t2 to time t3 in FIG. 5A represent rise and fall times of a pulser, and can each be approximately ten nanoseconds (10 ns) or less.

Figure 5B:
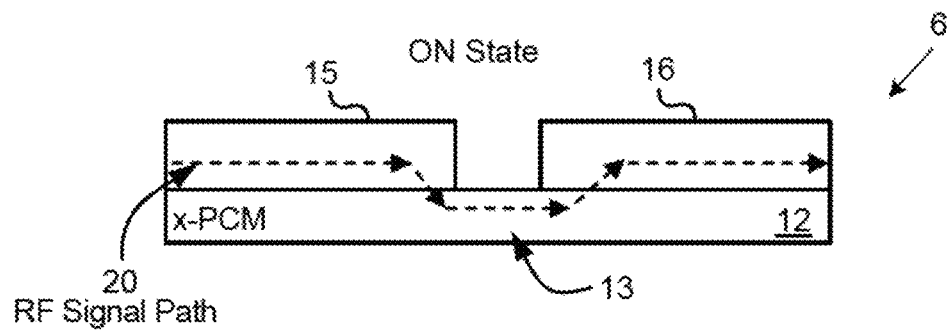
FIG. 5B illustrates a portion of an exemplary PCM RF switch in an ON state according to one implementation of the present application.

FIG. 5B illustrates a portion of an exemplary PCM RF switch in an ON state according to one implementation of the present application. PCM RF switch 6 in FIG. 5B generally corresponds to PCM RF switch 6 in FIG. 4, and may have any implementations or advantages described above. As illustrated in FIG. 5B, PCM RF switch 6 includes PCM 12 having active segment 13, PCM contacts 15 and 16, and RF signal path (or simply referred to as "RF signal") 20.

FIG. 5B illustrates PCM RF switch 6 after a crystallizing electrical pulse, such as crystallizing electrical pulse 19 in FIG. 5A, is applied to a heating element. As shown in FIG. 5B, PCM 12 is uniform and is denoted with the label "x-PCM." to indicate that PCM 12, including active segment 13 of PCM 12, is in the crystalline phase. PCM 12 in the crystalline phase has low resistivity and is able to easily conduct electrical current. Accordingly, RF signal 20 propagates along a path from PCM contact 15, through PCM 12, to PCM contact 16. It is noted that PCM contacts 15 and 16 can be substantially symmetrical and that their roles in PCM RF switch 6 can be reversed. PCM RF switch 6 in FIG. 5B is in an ON state.

Figure 6A:
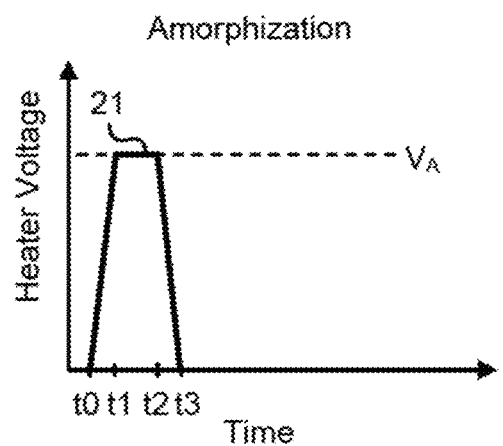
FIG. 6A illustrates an exemplary graph of heater voltage versus time according to one implementation of the present application.

FIG. 6A illustrates an exemplary graph of heater voltage versus time according to one implementation of the present application. The heater voltage-time graph in FIG. 6A represents the voltage at a heater contact of a heating element, such as heater contact 18 of heating element 9 in FIG. 4, plotted over time when amorphizing electrical pulse 21 is applied to the heating element. As shown in FIG. 6A, from time t0 to time t1, amorphizing electrical pulse 21 rises from zero voltage to approximately amorphization voltage $V_A$. From time t1 to time t2, amorphizing electrical pulse 21 remains approximately at amorphization voltage $V_A$. From time t2 to time t3, amorphizing electrical pulse 21 falls from approximately amorphization voltage $V_A$ to zero voltage.

An electrical pulse that holds the heating element at or above amorphization voltage $V_A$ for a brief amount of time will cause the heating element to generate an amorphizing heat pulse that will transform a PCM into an amorphous phase. Accordingly, such an electrical pulse is referred to as an "amorphizing electrical pulse" in the present application. Amorphization voltage $V_A$ and how briefly that voltage can be held to transform the PCM into an amorphous phase depends on various factors, such as the material, dimensions, temperature, and thermal conductivity of the heating element, the PCM, and their neighboring structures. In one implementation, amorphization voltage $V_A$ can be approximately fifteen volts (15 V). In one implementation, the time required can range from approximately fifty nanoseconds or less to approximately five hundred nanoseconds or less (50 ns-500 ns). In the present exemplary implementation, the duration from time t1 to time t2 in FIG. 6A can be approximately one hundred nanoseconds (100 ns). The duration from time t0 to time t1 and the duration from time t2 to time t3 in FIG. 6A represent rise and fall times of a pulser, and can each be approximately ten nanoseconds (10 ns) or less.

Figure 6B:
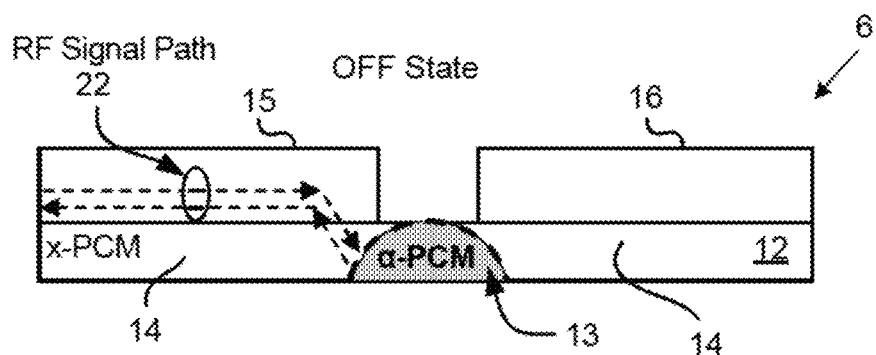
FIG. 6B illustrates a portion of an exemplary PCM RF switch in an OFF state according to one implementation of the present application.

FIG. 6B illustrates a portion of an exemplary PCM RF switch in an OFF state according to one implementation of the present application. PCM RF switch 6 in FIG. 6B generally corresponds to PCM RF switch 6 in FIG. 4, and may have any implementations or advantages described above. As illustrated in FIG. 6B, PCM RF switch 6 includes PCM 12 having active segment 13 and passive segments 14, PCM contacts 15 and 16, and RF signal path (or simply referred to as "RF signal") 22.

FIG. 6B illustrates PCM RF switch 6 after an amorphizing electrical pulse, such as amorphizing electrical pulse 21 in FIG. 6A, is applied to a heating element. As shown in FIG. 6B, PCM 12 is not uniform. Active segment 13 is denoted with the label "α-PCM," to indicate that active segment 13 is in the amorphous phase. Passive segments 14 are denoted with the label "x-PCM," to indicate that passive segments 14 are in the crystalline phase. As described above, "active segment" refers to a segment of PCM that transforms between crystalline and amorphous phases, whereas "passive segment" refers to a segment of PCM that does not make such transformation and maintains a crystalline phase (i.e., maintains a conductive state). Active segment 13 of PCM 12 in the amorphous phase has high resistivity and is not able to conduct electrical current well. Accordingly, RF signal 22 does not propagate along a path from PCM contact 15, through PCM 12, to PCM contact 16. It is noted that PCM contacts 15 and 16 can be substantially symmetrical and that their roles in PCM RF switch 6 can be reversed. PCM RF switch 6 in FIG. 6B is in an OFF state.

Referring back to FIG. 4, as PCM RF switch 6 is cycled OFF and ON numerous times during its lifetime operation, heating element 9 repeatedly generates heat pulses that transform active segment 13 of PCM 12 between amorphous and crystalline phases in response to amorphizing electrical pulses and crystallizing electrical pulses, such as amorphizing electrical pulse 21 in FIG. 6A and crystallizing electrical pulse 19 in FIG. 5A. These heat pulses, particularly amorphizing heat pulses, can achieve temperatures in excess of seven hundred degrees Celsius (700° C.). Repetition of such high temperatures can cause annealing and other thermophysical hysteresis effects which detrimentally skew the conductivity of PCM 12 over time. Conductivity skew (i.e. undesirable change in resistance) of PCM 12 can result in PCM RF switch 6 having higher insertion losses in the ON state.

The degree of conductivity skew is difficult to predict using conventional means. Conductivity skew can be infrequent and random in nature. Computer simulations cannot accurately predict the conductivity of PCM 12 over an entire lifetime. It might be necessary to perform more than one million OFF/ON cycles before PCM 12 exhibits any detectable conductivity skew. Further, it might be necessary to detect conductivity skew in thousands of PCM RF switches 6 in order to achieve statistically significant results regarding the degree of conductivity skew for a given PCM RF switch design. For example, twenty thousand PCM RF switches 6 may each have to be tested through one million OFF/ON cycles to confidently determine the average conductivity skew and the variance in conductivity skew for a given PCM RF switch design. As described above, it could take a day or longer to complete more than one million OFF/ON cycles for a single PCM RF switch 6. Testing all twenty thousand PCM RF switches 6 on a single ROIC 2 (shown in FIG. 2) would take an impractically long time. Moreover, conductivity skew in crystalline and amorphous phases is not always equal. Differentiating the two would take twice as long.

Figure 7:
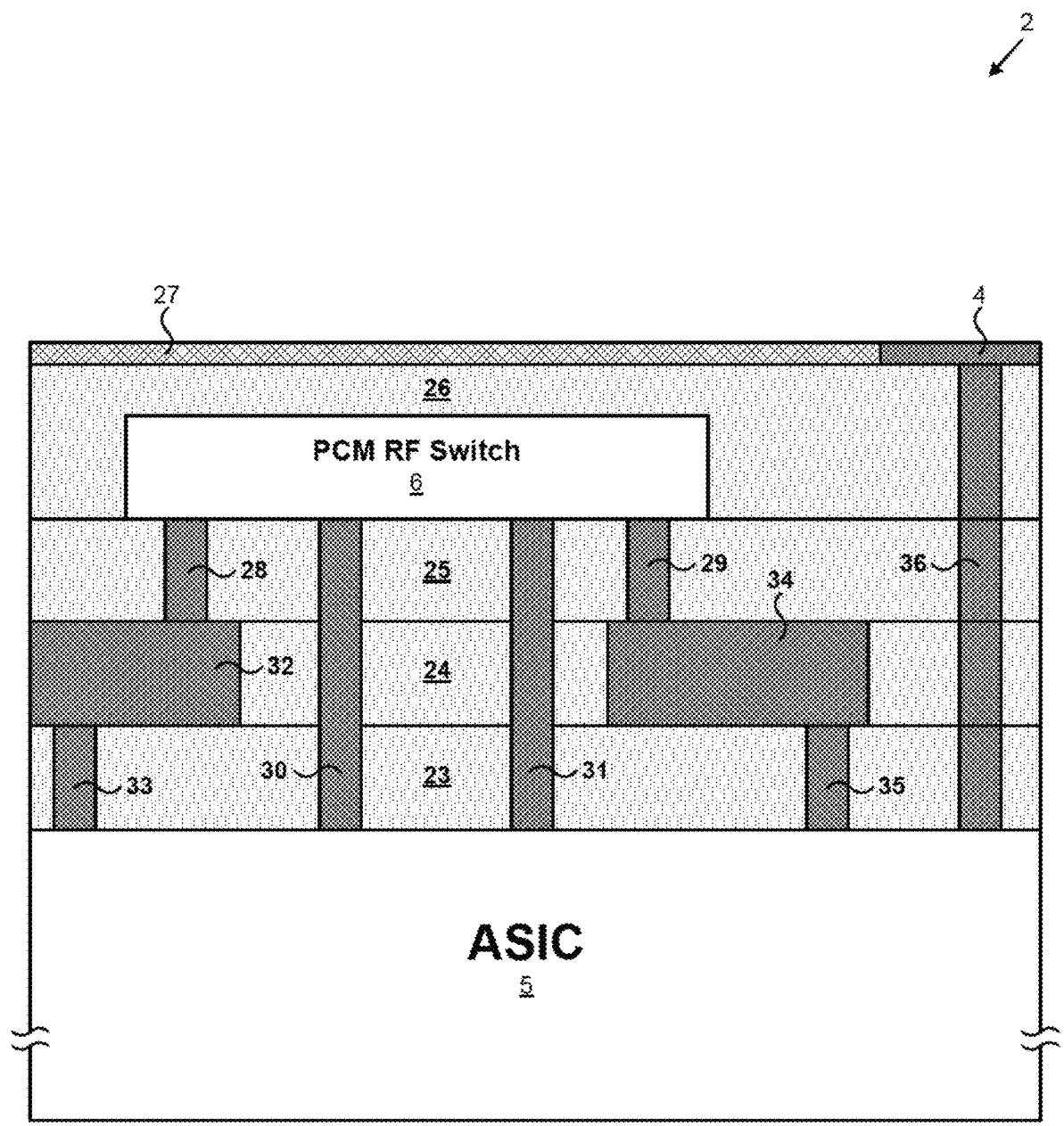
FIG. 7 illustrates a cross-sectional view of a portion of a rapid testing ROIC according to one implementation of the present application.

FIG. 7 illustrates a cross-sectional view of a portion of a rapid testing ROIC according to one implementation of the present application. ROIC 2 includes ASIC 5, PCM RF switch 6, pre-metal dielectric 23, first metallization level 24, first interlayer dielectric 25, second metallization level 26, passivation 27, vias 28, 29, 30, 31, 33, 35, and 36, interconnect metals 32 and 34, and contact pad 4. It is noted that in the present application, multiple vias, metal segments, and contacts connected as a unit may be referred to as a "via" for ease of reference. For example, in FIG. 7, via 36 includes a contact in pre-metal dielectric 23, a first metal segment in first metallization level 24, a first via in first interlayer dielectric 25, and a second metal segment in second metallization level 26. Metal segments are typically wider than vias and contacts and include overplots; however, for ease of illustration and for focus on the present inventive concepts, the metal segments and vias and contacts are shown as one continuous "via" 36 in ROIC 2.

PCM RF switch 6 in FIG. 7 generally corresponds to PCM RF switch 6 in FIG. 4, and may have any implementations and advantages described above. However, PCM RF switch 6 is shown with less detail in FIG. 7 to preserve conciseness. Pre-metal dielectric 23 is situated over ASIC 5. First metallization level 24, first interlayer dielectric 25, second metallization level 26, and passivation 27 are sequentially situated over pre-metal dielectric 23. In various implementations, pre-metal dielectric 23 can comprise borophosphosilicate glass (BPSG), tetra-ethyl ortho-silicate (TEOS), silicon onynitride ($Si_XO_YN_Z$), silicon oxide ($Si_XO_Y$), silicon nitride ($Si_XN_Y$), or another dielectric. In various implementations, first interlayer dielectric 25 and passivation 27 can comprise $Si_XO_Y$, $Si_XN_Y$, or another dielectric. For example, in one implementation, first interlayer dielectric 25 comprises chemical vapor deposition (CVD) $Si_XO_Y$, and passivation 27 comprises high density plasma CVD (HDP-CVD) $Si_XN_Y$. Moreover, first metallization level 24 and second metallization level 26 can comprise $Si_XO_Y$, $Si_XN_Y$, or another dielectric between metal segments in each metallization level. For example, in one implementation, first metallization level 24 and second metallization level 26 can include HDP-CVD $Si_XO_Y$ between metal segments in each metallization level. In various implementations, ROIC 2 can include more metallization levels and/or more interlayer dielectrics than those shown in FIG. 7.

PCM RF switch 6 is situated in second metallization level 26. Vias 28, 29, 30, and 31 are situated below PCM RF switch 6. Vias 28 and 29 electrically connect to PCM contacts 15 and 16 respectively (shown in FIG. 4) of PCM RF switch 6. Vias 30 and 31 electrically connect to heater contacts 17 and 18 respectively (shown in FIG. 4) of PCM RF switch 6. Via 33 is situated in pre-metal dielectric 23 between ASIC 5 and interconnect metal 32. Interconnect metal 32 is situated in first metallization level 24. Via 28 extends through first interlayer dielectric 25 between interconnect metal 32 and PCM RF switch 6. Via 28, interconnect metal 32, and via 33 electrically connect ASIC 5 to PCM contact 15 (shown in FIG. 4) of PCM RF switch 6. Via 35 is situated in pre-metal dielectric 23 between ASIC 5 and interconnect metal 34. Interconnect metal 34 is situated in first metallization level 24. Via 29 extends through first interlayer dielectric 25 between interconnect metal 34 and PCM RF switch 6. Via 29, interconnect metal 34, and via 35 electrically connect ASIC 5 to PCM contact 16 (shown in FIG. 4) of PCM RF switch 6. Via 30 and 31 electrically connect heater contacts 17 and 18 respectively (shown in FIG. 4) of PCM RF switch 6 to ASIC 5. Contact pad 4 is situated at the top of ROIC 2 and in a window in passivation 27. Via 36 electrically connects ASIC 5 to contact pad 4.

In various implementations, ROIC 2 can include more or fewer vias and/or interconnect metals than those shown in FIG. 7. Vias and interconnect metals can also electrically connect to other structures (not shown in FIG. 7), such as passive devices built in various metallization levels. Also, it is noted that the actual relative position of vias 28, 29, 30, and 31 may be different from the exemplary cross-sectional view shown in FIG. 7. For example, via 30 in FIG. 7 (connected to heater contact 17 in FIG. 4) may be situated on a different plane relative to vias 28 and 29 (connected to PCM contacts 15 and 16 in FIG. 4 respectively), and via 31 in FIG. 7 (connected to heater contact 18 in FIG. 4) may be situated on yet a different plane relative to vias 28 and 29. In other words, vias 28 and 29 may be situated in different planes and crosswise to vias 30 and 31.

As described below, ASIC 5 includes circuitry for testing PCM RF switch 6, such as circuitry for generating crystallizing and amorphizing electrical pulses and circuitry for generating test signals. Vias 28, 29, 30, 31, 33, 35, and 36 and interconnect metals 32 and 34 provide connections between this test circuitry and PCM RF switch 6. ASIC 5 is also electrically connected to contact pad 4. Contact pad 4 in FIG. 7 generally corresponds to any of contact pads 4 in FIG. 2. As described above, contact pad 4 provides a contact point for external probes (not shown in FIG. 7) used for reading out test data generated by ROIC 2 and for other functions, such as providing power and/or ground to ROIC 2, and providing bi-directional communications between ROIC 2 and an ATE.

Figure 8A:
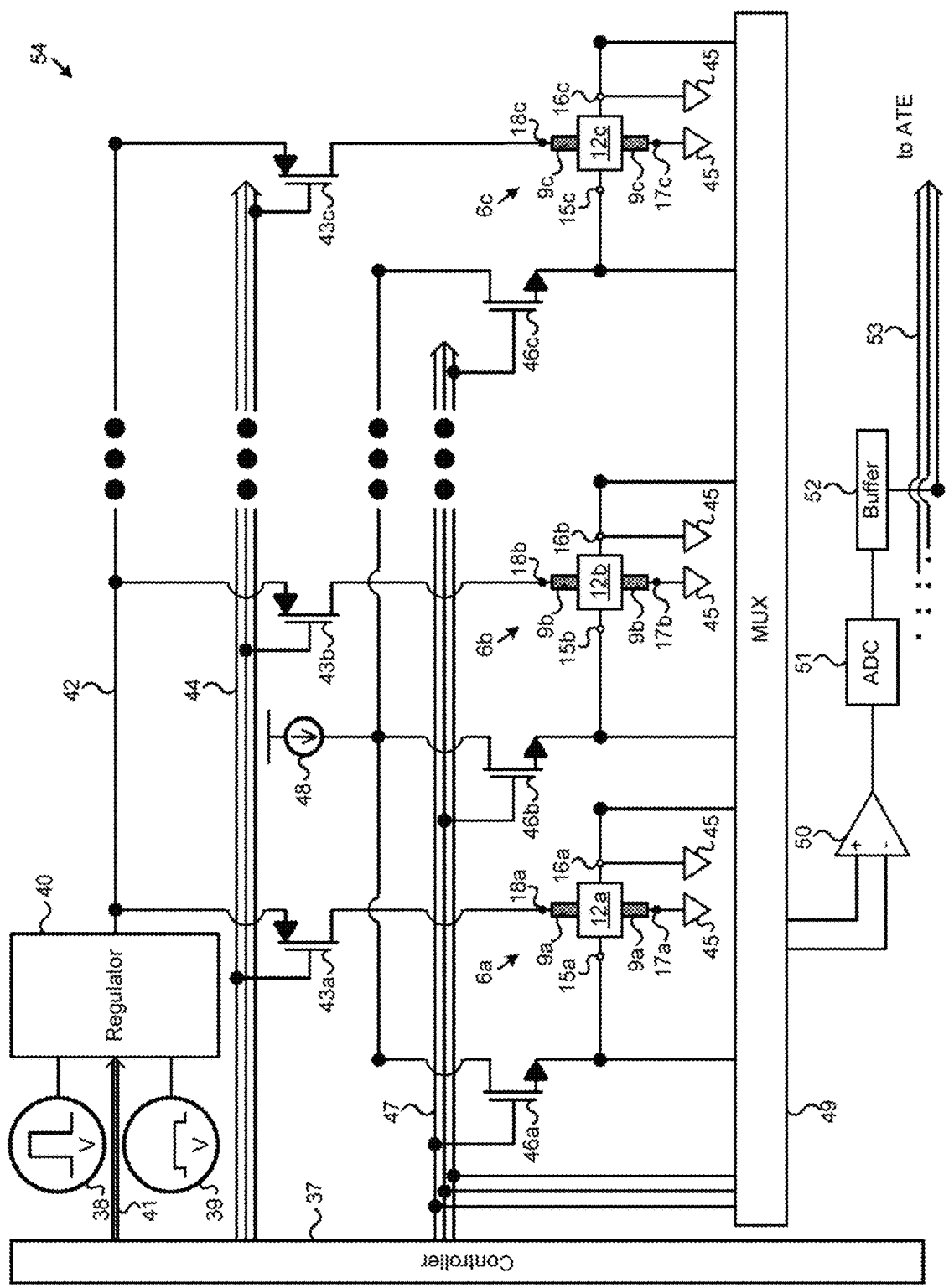
FIG. 8A illustrates a circuit in a portion of a rapid testing ROIC according to one implementation of the present application.

FIG. 8A illustrates a circuit in a portion of a rapid testing ROIC according to one implementation of the present application. As shown in FIG. 8A, circuit 54 includes PCM RF switches 6a, 6b, and 6c, controller 37, pulsers 38 and 39, regulator 40, regulator control bus 41, pulser line 42, voltage pulse enable transistors 43a, 43b, and 43c, voltage pulse enable control bus 44, ground 45, test current enable transistors 46a, 46b, and 46c, test current enable control bus 47, current source 48, multiplexer (MUX) 49, differential amplifier 50, analog-to-digital converter (ADC) 51, buffer 52, and read out bus 53. Circuit 54 in FIG. 8A generally illustrates test circuitry that supports any one of designs 3 in FIG. 2. Components other than PCM RF switches 6a, 6b, and 6c and connections thereto are situated in an ASIC, such as ASIC 5 in FIG. 2. PCM RF switches 6a, 6b, and 6c in FIG. 8A generally correspond to PCM RF switch 6 in FIG. 4 and may have any implementations and advantages described above.

Controller 37 provides general control over testing functions of circuit 54, as well as clocking and synchronization. In particular, controller 37 selects which of PCM RF switches 6a, 6b, and 6c will receive a crystallizing or an amorphizing electrical pulse, which type (a crystallizing or an amorphizing) the electrical pulse will be, and when to generate data for determining OFF state conductivity skew and ON state conductivity skew of PCMs 12a, 12b, and 12c in PCM RF switches 6a, 6b, and 6c.

Pulsers 38 and 39 generate electrical pulses. Pulser 38 periodically generates amorphizing electrical pulses, such as amorphizing electrical pulse 21 in FIG. 6A. Pulser 39 periodically generates crystallizing electrical pulses, such as crystallizing electrical pulse 19 in FIG. 5A. Pulsers 38 and 39 can have digitally programmable amplitudes, pulse widths, and periods. In one implementation, the pulse widths and periods of pulsers 38 and 39 are chosen such that the delay between the falling edge of a pulse and the rising edge of a subsequent pulse is approximately one microsecond (1 μs). In one implementation, pulsers 38 and 39 have rise times and fall times of approximately ten nanoseconds (10 ns) or less. In the present implementation, pulsers 38 and 39 are illustrated as voltage pulsers. However, as used in the present application, a "pulser" encompasses and includes a voltage pulser, a current pulser, or any other type of pulser, and a "voltage pulser" and a "voltage pulse" also encompass and include a "current pulser" and a "current pulse."

Regulator 40 is coupled to pulsers 38 and 39, controller 37, and pulser line 42. Based on input received from controller 37 along regulator control bus 41, regulator 40 allows electrical pulses from only one of pulsers 38 and 39 at a time, and blocks electrical pulses from the other. When circuit 54 is providing amorphizing electrical pulses to PCM RF switches 6a, 6b, and 6c, regulator 40 allows pulses from pulser 38 and blocks from pulser 39. Conversely, when circuit 54 is providing crystallizing electrical pulses to PCM RF switches 6a, 6b, and 6c, regulator 40 blocks pulses from pulser 38 and allows pulses from pulser 39. The allowed electrical pulses are output along pulser line 42. In one implementation, regulator 40 comprises multiple pass transistors whose gates are coupled to regulator control bus 41.

Voltage pulse enable transistors 43a, 43b, and 43c selectively provide crystallizing and amorphizing electrical pulses to PCM RF switches 6a, 6b, and 6c respectively. As used in the present application, the term "voltage pulse enable transistor" refers to a transistor capable of selectively providing an electrical pulse, regardless of whether the electrical pulse is a voltage pulse, a current pulse, or any other type of electrical pulse; and thus the term encompasses a "current pulse enable transistor" as well. In the present implementation, voltage pulse enable transistors 43a, 43b, and 43c are shown as p-type fields effect transistors (PFETs). In other implementations, voltage pulse enable transistors 43a, 43b, and 43c can be any other type of transistor. The drains of voltage pulse enable transistors 43a, 43b, and 43c are coupled to pulser line 42. The sources of voltage pulse enable transistors 43a, 43b, and 43c are coupled to respective heater contacts 18a, 18b, and 18c of respective heating elements 9a, 9b and 9c of respective PCM RF switches 6a, 6b, and 6c. Heater contacts 17a, 17b, and 17c are coupled to ground 45. The gates of voltage pulse enable transistors 43a, 43b, and 43c are coupled to voltage pulse enable control bus 44.

Based on input received from controller 37 along voltage pulse enable control bus 44, one of voltage pulse enable transistors 43a, 43b, and 43c can be selectively turned on, thereby providing crystallizing or amorphizing electrical pulses to a corresponding selected one of PCM RF switches 6a, 6b, and 6c. For example, controller 37 can turn on voltage pulse enable transistor 43a to select PCM RF switch 6a. If pulser line 42 is passing amorphizing electrical pulses from pulser 38, voltage pulse enable transistor 43a will provide an amorphizing electrical pulse to PCM RF switch 6a at heater contact 18a. Heating element 9a will generate a heat pulse that transforms an active segment of PCM 12a into an amorphous phase, and PCM RF switch 6a will switch to an OFF state. PCM RF switch will maintain an OFF state until voltage pulse enable transistor 43a provides it with a crystallizing electrical pulse.

Subsequently, controller 37 can then turn off voltage pulse enable transistor 43a and turn on voltage pulse enable transistor 43b to select PCM RF switch 6b. Similarly, controller 37 can then turn off voltage pulse enable transistor 43b and turn on voltage pulse enable transistor 43c to select PCM RF switch 6c. In one implementation, controller 37 can synchronize voltage pulse enable control bus 44 with the periods of electrical pulses at pulser line 42 such that each of voltage pulse enable transistors 43a. 43b, and 43c is only turned on for the duration of one electrical pulse (i.e., such that a single one of PCM RF switches 6a, 6b, or 6c is not provided with the same electrical pulse twice in a row). In one implementation, a dummy load can be coupled to pulser line 42 to keep current flowing when no voltage pulse enable transistors 43a, 43b, or 43c are turned on.

In practice, circuit 54 can include many more than the three PCM RF switches 6a, 6b, and 6c shown in FIG. 8A. For example, circuit 54 can have a total of one thousand (1,000) PCM RF switches corresponding to design 3 in FIG. 3. In one implementation, rather than using a single voltage pulse enable control bus 44 and one voltage pulse enable transistor per PCM RF switch, circuit 54 can include PCM RF switches arranged in an array, with one pulse enable transistor per row and one pulse enable transistor per column, along with a row enable control bus and a column enable control bus. In various implementations, circuit 54 can concurrently provide crystallizing and/or amorphizing pulses to multiple PCM RF switches at a time, for example, by using multiple sets of pulsers 38 and 39, or by using higher amplitude pulsers 38 and 39. In various implementations, heater contacts 17a, 17b, and 17c are not directly coupled to ground 45, and are coupled to intermediate components.

In addition to the circuitry described above for providing crystallizing and amorphizing electrical pulses to switch PCM RF switches 6a, 6b, and 6c between OFF and ON states, design 3 in FIG. 8A includes circuitry for generating data for determining OFF state conductivity skew and ON state conductivity skew of PCMs 12a, 12b, and 12c in PCM RF switches 6a. 6b, and 6c. As described above, this test circuitry is situated in an ASIC, such as ASIC 5 in FIG. 2.

Test current enable transistors 46a, 46b, and 46c provide test currents to PCM RF switches 6a, 6b, and 6c respectively. As used in the present application, the term "test current enable transistor" refers to a transistor capable of selectively providing test power, regardless of whether the test power is a test current, a test voltage, or any other type of test power; thus the term also encompasses a "test voltage enable transistor." In the present implementation, test current enable transistors 46a, 46b, and 46c are shown as n-type fields effect transistors (NFETs). In other implementations, test current enable transistors 46a, 46b, and 46c can be any other type of transistor. The drains of test current enable transistors 46a, 46b, and 46c are coupled to current source 48. As used in the present application, the term "current source" refers to a power source, regardless of whether the power source is a current source, a voltage source, or any other type of power source; thus the term also encompasses a "voltage source." The sources of test current enable transistors 46a, 46b, and 46c are coupled to respective PCM contacts 15a, 15b, and 15c of respective PCMs 12a, 12b, and 12c of respective PCM RF switches 6a, 6b, and 6c. PCM contacts 16a, 16b, and 16c are coupled to ground 45. The gates of test current enable transistors 46a, 46b, and 46c are coupled to test current enable control bus 47.

Based on input received from controller 37 along test current enable control bus 47, test current enable transistors 46a, 46b, and 46c can be selectively turned on, thereby providing test currents to a corresponding selected one of PCM RF switches 6a, 6b, and 6c. For example, controller 37 can turn on test current enable transistors 46a to select PCM RF switch 6a. Test current enable transistor 46a will provide a test current from current source 48 to PCM RF switch 6a at PCM contact 15a. Assuming PCM RF switch 6a was recently provided with a crystallizing electrical pulse and functions properly, the test current will propagate along a path from PCM contact 15a, through PCM 12a, to PCM contact 16a. Because PCM RF switch 6a is in an ON state (i.e., low-resistance state) and because PCM contact 16a is grounded, the voltage at PCM contact 15a will be low or approximately equal to ground. Conversely, assuming PCM RF switch 6a was recently provided with an amorphizing electrical pulse and functions properly, the voltage at PCM contact 15a will be high, because PCM RF switch 6a is in an OFF state (i.e., high-resistance state).

MUX 49 is coupled to PCM contacts 15a, 15b, 15c, 16a, 16b, and 16c. MUX 49 is also coupled to test current enable control bus 47. Based on input received from controller 37 along test current enable control bus 47, MUX 49 transfers voltages from a selected pair of PCM contacts. In the present implementation, the same input received by test current enable transistors 46a, 46b, and 46c along test current enable control bus 47 is also received by MUX 49. Thus, the pair of PCM contacts selected by MUX 49 corresponds to the PCM RF switch selected by test current enable transistors 46a, 46b, and 46c. Continuing the above example, when test current enable transistor 46a selectively provides a test current to PCM RF switch 6a, MUX 49 selectively transfers the voltages at corresponding PCM contacts 15a and 16a. In one implementation, MUX 49 may receive input from controller 37 separate from test current enable control bus 47.

Differential amplifier 50 is coupled to MUX 49. MUX 49 outputs the transferred voltages to respective input terminals of differential amplifier 50. Differential amplifier 50 outputs a signal proportional to the difference between the voltages. Continuing the above example, when test current enable transistor 46a selectively provides a test current to PCM RF switch 6a, differential amplifier 50 outputs a signal proportional to a voltage difference between PCM contacts 15a and 16a. In various implementations, differential amplifier 50 can be an instrumentation amplifier, an operational amplifier, or any other type of differential amplifier. In one implementation, differential amplifier 50 has a fixed gain. In one implementation, differential amplifier 50 has a gain of approximately twenty five (25).

The signals output by differential amplifier 50 represent test data for determining conductivity skew. For example, where the value of a test current provided by current source 48 and the gain of differential amplifier 50 are both known, the resistance across PCM 12a can be extrapolated from the output of differential amplifier 50; the conductivity of PCM 12a can be extrapolated based on this resistance and the dimensions of PCM 12a. Moreover, if a subsequent output from differential amplifier 50 is compared with an initial output from differential amplifier 50, the change in conductivity (i.e., the conductivity skew) can be determined.

It is noted that, while data for determining conductivity skew is generated by circuit 54 situated in an ASIC, such as ASIC 5 in FIG. 2, the actual determination of conductivity skew (including the extrapolation of conductivities and comparison between initial and subsequent conductivities) may either be performed in ASIC 5 itself, for example, by a micro-computer (not shown) in ASIC 5, or may be performed external to ASIC 5, for example, by an ATE after ASIC 5 has provided the data to an external probe coupled to the ATE.

ADC 51 is coupled to differential amplifier 50. ADC 51 converts the data for determining conductivity skew from analog to digital form. It is noted that the power supplies for ADC 51, differential amplifier 50, current source 48, pulsers 38 and 39, and controller 37 may be provided by an external source, for example, through any of contact pads 4 in FIG. 2, or by a micro-battery or other energy conversion means in the ROIC itself.

Buffer 52 is coupled to ADC 51. Buffer 52 is configured to store data for determining conductivity skew in circuit 54. Buffer 52 can be any memory element known in the art.

Circuit 54 in FIG. 8A can generate and store data for determining conductivity skew each time a test current is provided to PCM RF switches 6a, 6b, and 6c. For example, after controller 37 turns on test current enable transistor 46a and circuit 54 generates and stores data for determining conductivity skew of PCM 12a, controller 37 can then turn off test current enable transistor 46a and turn on test current enable transistor 46b to selectively provide a test current from current source 48 to PCM RF switch 6b. Circuit 54 can then generate and store data for determining conductivity skew of PCM 12b. Similarly, controller 37 can then turn off test current enable transistor 46b and turn on test current enable transistor 46c to selectively provide a test current from current source 48 to PCM RF switch 6c. Circuit 54 can then generate and store data for determining conductivity skew of PCM 12c. Thus, circuit 54 can generate and store data for determining conductivity skew of each PCM in a ROIC.

Controller 37 can synchronize test current enable control bus 47 with voltage pulse enable control bus 44, such that circuit 54 generates data for determining both OFF state conductivity skew and ON state conductivity skew of PCMs 12a, 12b, and 12c. For example, in response to voltage pulse enable transistors 43a, 43b, or 43c providing amorphizing electrical pulses to PCM RF switches 6a, 6b, and 6c, test current enable transistors 46a, 46b, and 46c can provide a test current from current source 48 to PCM RF switches 6a, 6b, and 6c, and circuit 54 can generate data for determining OFF state conductivity skew of PCMs 12a, 12b, and 12c. Similarly, in response to voltage pulse enable transistors 43a, 43b, or 43c providing crystallizing electrical pulses to PCM RF switches 6a, 6b, and 6c, test current enable transistors 46a, 46b, and 46c can provide a test current from current source 48 to PCM RF switches 6a, 6b, and 6c, and circuit 54 can generate data for determining ON state conductivity skew of PCMs 12a, 12b, and 12c.

In the present implementation, circuit 54 includes a single current source 48 and a single differential amplifier 50. Thus, circuit 54 provides a test current to PCM RF switches 6a. 6b, and 6c one at a time, and generates data for determining conductivity skew of PCMs 12a, 12b, and 12c one at a time. In another implementation, circuit 54 can include multiple current sources and/or multiple differential amplifiers to concurrently generate data for determining conductivity skew of PCMs 12a, 12b, and 12c.

In one implementation, current source 48 can provide different test currents in response to crystallizing electrical pulses than in response to amorphizing electrical pulses. For example, after voltage pulse enable transistors 43a, 43b, or 43c provide amorphizing electrical pulses to PCM RF switches 6a. 6b, and 6c, current source 48 can provide a ten microampere (10 μA) test current to PCM RF switches 6a, 6b, and 6c; meanwhile, after voltage pulse enable transistors 43a, 43b, or 43c provide crystallizing electrical pulses to PCM RF switches 6a, 6b, and 6c, current source 48 can provide a ten milliampere (10 mA) test current to PCM RF switches 6a, 6b, and 6c.

In one implementation, circuit 54 redundantly tests to eliminate sources error. For example, after generating data for determining OFF state conductivity skew of PCMs 12a, 12b, and 12c, rather than proceeding to provide crystallizing electrical pulses to PCM RF switches 6a. 6b, and 6c, circuit 54 can generate data for determining OFF state conductivity skew of PCMs 12a. 12b, and 12c again. Similarly, after generating data for determining ON state conductivity skew of PCMs 12a, 12b, and 12c, rather than proceeding to provide amorphizing electrical pulses to PCM RF switches 6a, 6b, and 6c, circuit 54 can generate data for determining ON state conductivity skew of PCMs 12a, 12b, and 12c again. Redundant data for determining conductivity skew can be compiled and analyzed to account for noise or other random errors. In various implementations, redundant data can be averaged, or used to discard outliers.

It is noted that, while redundant data for determining conductivity skew is generated by circuit 54 situated in an ASIC, such as ASIC 5 in FIG. 2, its actual compilation and analysis may either be performed in ASIC 5 itself, for example, by a micro-computer (not shown) in ASIC 5, or may be performed external to ASIC 5, for example, by an ATE after ASIC 5 has provided the data to an external probe coupled to the ATE.

Using read out bus 53, buffer 52 is configured to provide data for determining OFF state conductivity skew and ON state conductivity skew to external probes coupled to an ATE (not shown in FIG. 8A). In one implementation, read out bus 53 is a serial peripheral interface (SPI) implemented using contact pads 4 in FIG. 2. Read out bus 53 can shared by multiple designs 3 in ROIC 2. For example, where circuit 54 in FIG. 8A supports one design 3 in FIG. 2, read out bus 53 can be coupled to another buffer in another circuit that supports another design 3. In one implementation, buffer 52 may read out data for determining conductivity skew each time it is generated. In another implementation, buffer 52 may read out data for determining conductivity skew after a fixed number of cycles. In yet another implementation, buffer 52 may read out data for determining conductivity skew whenever buffer 52 reaches a storage limit, after which buffer 52 can be reset. Data for determining OFF state conductivity skew and ON state conductivity skew read out from buffer 52 can also be combined with addressing information and/or other information provided by controller 37 to distinguish which PCM RF switches the data corresponds to, which cycles the data was generated after, and whether the data was generated in response to a crystallizing or an amorphizing electrical pulse (e.g., data generated on PCM RF switch number 968 on cycle number 262,395 after the amorphizing pulse).

Figure 8B:
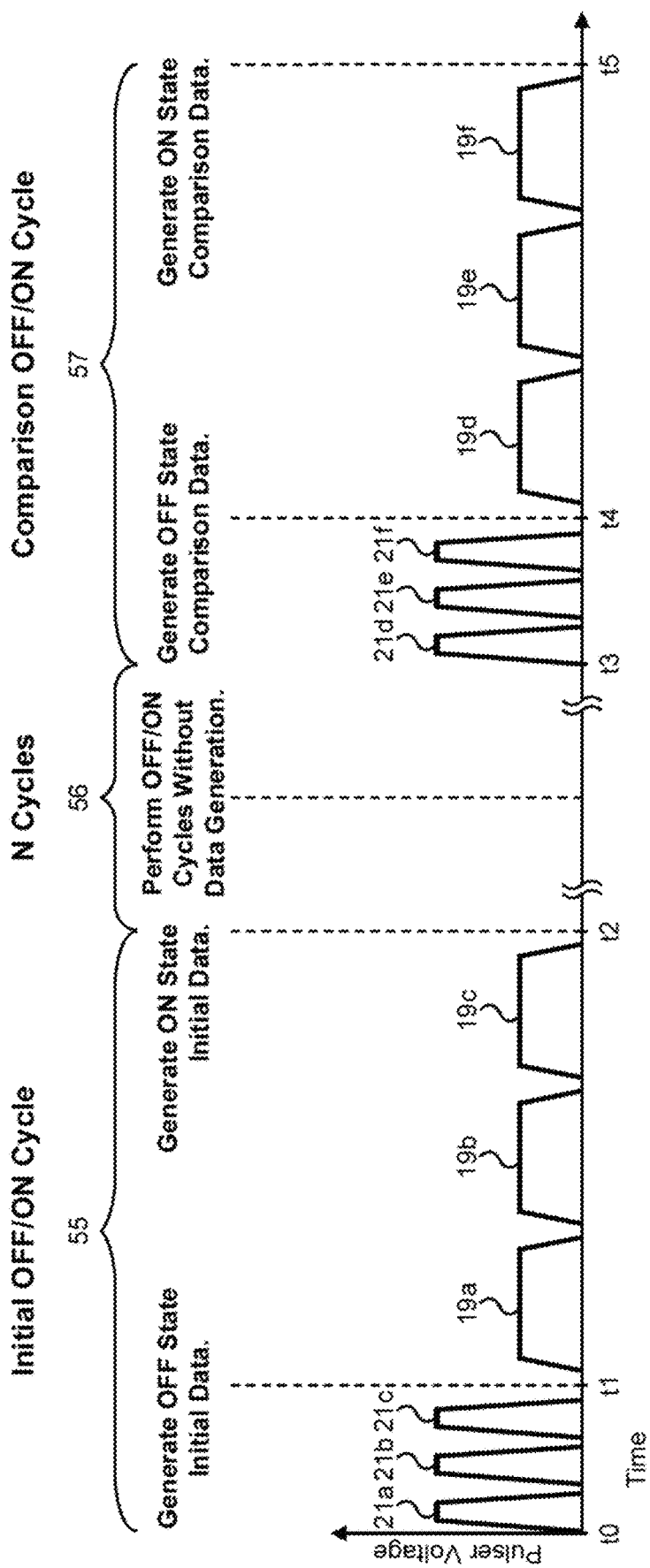
FIG. 8B illustrates an exemplary graph of pulser voltage versus time according to one implementation of the present application.

FIG. 8B illustrates an exemplary graph of pulser voltage versus time according to one implementation of the present application. The pulser voltage-time graph in FIG. 8B represents the voltage at a pulser line, such as pulser line 42 in FIG. 8A, plotted over time. Accordingly, the graph in FIG. 8B is described below with reference to the circuit design in FIG. 8A. From time t0 to time t1 in FIG. 8B, regulator 40 in FIG. 8A is passing pulser 38. As shown in FIG. 8B, amorphizing electrical pulses 21a, 21b, and 21c are sequentially applied by pulser line 42. During amorphizing electrical pulse 21a in FIG. 8B, voltage pulse enable transistor 43a in FIG. 8A is turned on. Voltage pulse enable transistor 43a in FIG. 8A can be turned on prior to time t0 in order to account for a turn-on time delay of voltage pulse enable transistor 43a. Voltage pulse enable transistor 43a in FIG. 8A can also be turned off prior to time t2 in order to account for a turn-off time delay of voltage pulse enable transistor 43a. Similarly, during amorphizing electrical pulses 21b and 21c in FIG. 8B, voltage pulse enable transistors 43b and 43c in FIG. 8A are turned on respectively.

Amorphizing electrical pulses 21a, 21b, and 21c generally correspond to amorphizing electrical pulse 21 shown in FIG. 6A, and may have any implementations or advantages described above. For example, each of amorphizing electrical pulses 21a, 21b, and 21c can have a rise time of approximately ten nanoseconds (10 ns), a pulse width of approximately one hundred nanoseconds (100 ns), and a fall time of approximately ten nanoseconds (10 ns). In one implementation, the delay between the falling edge of amorphizing electrical pulse 21a and the rising edge of subsequent amorphizing electrical pulse 21b, as well as the delay between the falling edge of amorphizing electrical pulse 21b and the rising edge of subsequent amorphizing electrical pulse 21c, are each approximately one microsecond (1 μs).

At time t1 in FIG. 8B, all PCM RF switches 6a, 6b, and 6c in FIG. 8A are presumed to be in OFF states, and test current enable transistors 46a, 46b, and 46c are selectively turned on to provide a test current from current source 48 to PCM RF switches 6a, 6b, and 6c. Differential amplifier 50 outputs signals proportional to voltage differences between PCM contacts 15a and 16a, PCM contacts 15b and 16b, and PCM contacts 15c and 16c. Thus, circuit 54 generates initial data for determining OFF state conductivity skew of PCMs 12a, 12b, and 12c. In one implementation, the time it takes for circuit 54 to generate initial data for determining OFF state conductivity skew for a single PCM is approximately ten nanoseconds (10 ns). In one implementation, the timing scheme of controller 37 is configured such that PCMs 12a, 12b, and 12c of PCM RF switches 6a. 6b, and 6c have at least ten microseconds (10 μs) to cool and stabilize after the end of their respective amorphizing electrical pulses 21a. 21b, and 21c before test current enable transistors 46a, 46b, and 46c provide the test current to their respective PCMs 12a, 12b, and 12c.

As described above, in practice, circuit 54 in FIG. 8A will have many more than the three PCM RF switches 6a, 6b, and 6c. Accordingly, the graph in FIG. 8B may have more than three amorphizing electrical pulses 21*a*, 21*b*, and 21*c* between time t0 and the provision of test currents at the beginning of time t1. Where circuit 54 includes one thousand (1,000) PCM RF switches, the total time between t0 and the generation of all initial data for determining OFF state conductivity skew at the end of time t1 can be approximately one thousand one hundred and forty microseconds (1,140 µs).

From time t1 to time t2 in FIG. 8B, regulator 40 in FIG. 8A is blocking pulser 38 and passing pulser 39. As shown in FIG. 8B, crystallizing electrical pulses 19*a*, 19*b*, and 19*c* are sequentially applied by pulser line 42. During crystallizing electrical pulse 19*a* in FIG. 8B, voltage pulse enable transistor 43*a* in FIG. 8A is turned on. Voltage pulse enable transistor 43*a* in FIG. 8A can be turned on prior to time t5 in order to account for a turn-on time delay of voltage pulse enable transistor 43*a*. Voltage pulse enable transistor 43*a* in FIG. 8A can also be turned off prior to time t6 in order to account for a turn-off time delay of voltage pulse enable transistor 43*a*. Similarly, during crystallizing electrical pulses 19*b* and 19*c* in FIG. 8B, voltage pulse enable transistors 43*b* and 43*c* in FIG. 8A are turned on respectively.

Crystallizing electrical pulses 19*a*, 19*b*, and 19*c* generally correspond to crystallizing electrical pulse 19 shown in FIG. 5A, and may have any implementations or advantages described above. For example, each of crystallizing electrical pulses 19*a*, 19*b*, and 19*c* can have a rise time of approximately ten nanoseconds (10 ns), a pulse width of approximately one thousand nanoseconds (1,000 ns), and a fall time of approximately ten nanoseconds (10 ns). In one implementation, the delay between the falling edge of crystallizing electrical pulse 19*a* and the rising edge of subsequent crystallizing electrical pulse 19*b*, as well as the delay between the falling edge of crystallizing electrical pulse 19*b* and the rising edge of subsequent crystallizing electrical pulse 19*c*, are each approximately one microsecond (1 µs).

At time t2 in FIG. 8B, all PCM RF switches 6*a*, 6*b*, and 6*c* in FIG. 8A are presumed to be in ON states, and test current enable transistors 46*a*, 46*b*, and 46*c* are selectively turned on to provide a test current from current source 48 to PCM RF switches 6*a*. 6*b*, and 6*c*. Differential amplifier 50 outputs signals proportional to voltage differences between PCM contacts 15*a* and 16*a*, PCM contacts 15*b* and 16*b*, and PCM contacts 15*c* and 16*c*. Thus, circuit 54 generates initial data for determining ON state conductivity skew of PCMs 12*a*. 12*b*, and 12*c*. In one implementation, the time it takes for circuit 54 to generate initial data for determining ON state conductivity skew for a single PCM is approximately ten nanoseconds (10 ns). In one implementation, the timing scheme of controller 37 is configured such that PCMs 12*a*, 12*b*, and 12*c* of PCM RF switches 6*a*, 6*b*, and 6*c* have at least ten microseconds (10 µs) to cool and stabilize after the end of their respective crystallizing electrical pulses 19*a*, 19*b*, and 19*c* before test current enable transistors 46*a*, 46*b*, and 46*c* provide the test current to their respective PCMs 12*a*. 12*b*, and 12*c*.

As described above, in practice, circuit 54 in FIG. 8A will have many more than the three PCM RF switches 6*a*, 6*b*, and 6*c*. Accordingly, the graph in FIG. 8B may have more than three crystallizing electrical pulses 19*a*, 19*b*, and 19*c* between time t1 and the provision of test currents at the beginning of time t2. Where circuit 54 includes one thousand (1,000) PCM RF switches, the total time between t0 and the generation of all initial data for determining ON state conductivity skew at the end of time t2 can be approximately two thousand and forty microseconds (2,040 µs).

Continuing the above examples, the total time for initial OFF/ON cycle 55 (i.e., the time to switch one thousand (1,000) PCM RF switches in a single design 3 OFF and ON, generating data for determining conductivity skew after both OFF and ON states) can be approximately three thousand one hundred and eighty microseconds (3,180 µs).

After initial OFF/ON cycle 55, circuit 54 performs a plurality of OFF/ON cycles 56 from time t2 to time t3. OFF/ON cycles 56 are similar to initial OFF/ON cycle 55, except that circuit 54 does not provide test currents or generate data for determining conductivity skew during OFF/ON cycles 56. Rather, during OFF/ON cycles 56, circuit 54 simply alternates between providing amorphizing electrical pulses and crystallizing electrical pulses to PCM RF switches 6*a*, 6*b*, and 6*c*. OFF/ON cycles 56 are performed so that PCMs 12*a*, 12*b*, and 12*c* are repeatedly exposed to a significant number of amorphizing and crystallizing heat pulses and exhibit detectable conductivity skew. In one implementation, one million (1,000,000) OFF/ON cycles 56 are performed. Continuing the above examples, the total time for OFF/ON cycles 56 (i.e., the time to switch one thousand (1,000) PCM RF switches in a single design 3 OFF and ON one million (1,000,000) times each) can be approximately 3,140 seconds, i.e., approximately fifty three minutes (53 min).

After OFF/ON cycles 56, circuit 54 performs comparison OFF/ON cycle 57 from time t3 to time t5. Comparison OFF/ON cycle 57 is similar to initial OFF/ON cycle 55, except that comparison OFF/ON cycle 57 occurs later in time. During comparison OFF/ON cycle 57, starting at time t3, circuit 54 sequentially applies amorphizing electrical pulses 21*d*, 21*e*, and 21*f* to PCM RF switches 6*a*, 6*b*, and 6*c*. At time t4, circuit 54 generates comparison data for determining OFF state conductivity skew of PCMs 12*a*, 12*b*, and 12*c*. After the generation of all comparison data for determining OFF state conductivity skew at the end of time t4, circuit 54 sequentially applies crystallizing electrical pulses 19*d*, 19*e*, and 19*f* to PCM RF switches 6*a*, 6*b*, and 6*c*. At time t5, circuit 54 generates comparison data for determining ON state conductivity skew of PCMs 12*a*. 12*b*, and 12*c*. Continuing the above examples, the total time for comparison OFF/ON cycle 57 (i.e., the time to switch one thousand (1,000) PCM RF switches in a single design 3 OFF and ON, generating data for determining conductivity skew after both OFF and ON states) can be approximately three thousand one hundred and eighty microseconds (3,180 µs).

Continuing the above examples, the total time for circuit 54 to perform initial OFF/ON cycle 55, OFF/ON cycles 56, and comparison OFF/ON cycle 57 in FIG. 8B (i.e., the time to switch one thousand (1,000) PCM RF switches in a single design 3 through one million (1,000,000) OFF/ON cycles, generating initial and comparison data for determining conductivity skew for both OFF and ON states for each PCM RF switch) can be fifty three minutes (53 min).

Since each design 3 is supported by its own circuit 54, all twenty designs 3 (shown in FIG. 2) can cycle and generate data for determining OFF state conductivity skew and ON state conductivity skew in parallel. However, because there are significantly more PCM RF switches 6 than contact pads 4, the data is not necessarily read out from each of designs 3 in parallel. In one implementation, the time to read out the data from a single design 3 to external test probes of an ATE is approximately one millisecond (1 ms). The total time to read out errors and other test information from twenty designs 3 to external test probes of an ATE is approximately twenty milliseconds (i.e. 20 times 1 millisecond). Thus, the total time to complete one million cycles and read out for a ROIC, such as ROIC 2 in FIG. 2, is still approximately fifty three minutes (53 min).

In various implementations, circuit 54 generates data for determining OFF state conductivity skew and ON state conductivity skew more often or less often than shown in FIG. 8B. For example, circuit 54 can perform a comparison OFF/ON cycle 57 after ten thousand OFF/ON cycles 56. As another example, circuit 54 can perform only comparison OFF/ON cycles 57 without performing OFF/ON cycles 56. As yet another example, circuit 54 can perform a comparison OFF/ON cycle 57 after one million OFF/ON cycles 56, and then perform another comparison OFF/ON cycle 57 after five hundred thousand OFF/ON cycles 56.

Figure 8C:
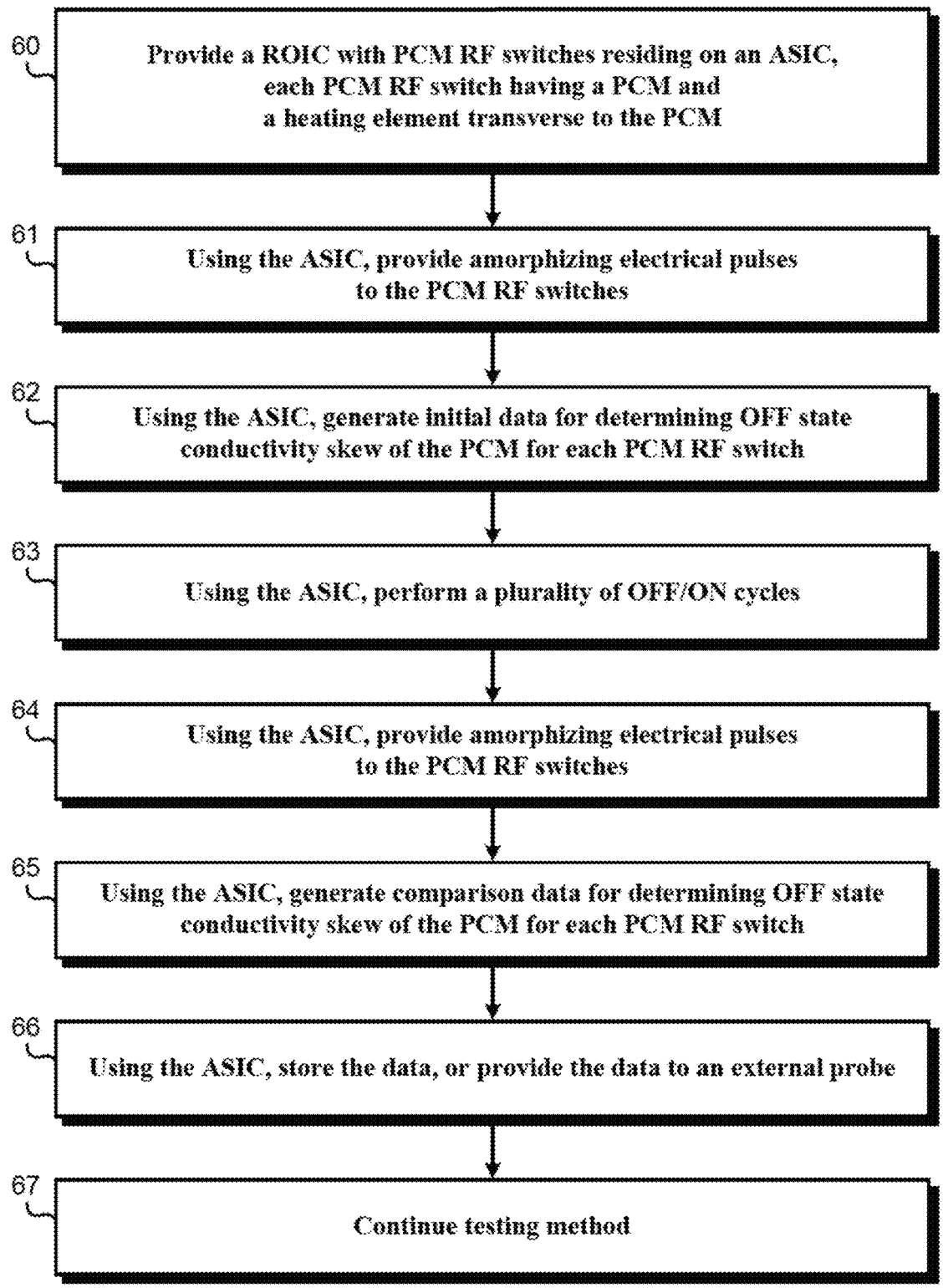
FIG. 8C illustrates a portion of a flowchart of an exemplary method for rapidly testing conductivity skew of PCM according to one implementation of the present application.

FIG. 8C illustrates a portion of a flowchart of an exemplary method for rapidly testing conductivity skew of PCM according to one implementation of the present application. Actions 60 through 67 shown in the flowchart of FIG. 8C are sufficient to describe one implementation of the present inventive concepts. Other implementations of the present inventive concepts may utilize actions different from those shown in the flowchart of FIG. 8C. Certain details and features have been left out of the flowchart of FIG. 8C that are apparent to a person of ordinary skill in the art. For example, an action may consist of one or more sub-actions or may involve specialized equipment or materials, as known in the art. Moreover, some actions are omitted so as not to distract from the illustrated actions.

The flowchart of FIG. 8C begins at action 60 by providing a ROIC with PCM RF switches residing on an ASIC, each PCM RF switch having a PCM and a heating element transverse to the PCM. The ROIC and ASIC can correspond to ROIC 2 and ASIC 5 in FIG. 2. The PCM RF switches can correspond to PCM RF switches 6a, 6b, and 6c in FIG. 8A.

The flowchart continues at action 61 by using the ASIC to provide amorphizing electrical pulses to the PCM RF switches. The amorphizing electrical pulses can correspond to amorphizing electrical pulses 21a, 21b, and 21c in FIG. 8B. The amorphizing electrical pulses 21a, 21b, and 21c can be generated by a pulser located in ASIC 5, such as pulser 38 in FIG. 8A. Amorphizing electrical pulses 21a, 21b, and 21c are provided to heater contacts of PCM RF switches 6a, 6b, and 6c, such as heater contacts 18a, 18b, and 18c in FIG. 8A. Amorphizing electrical pulses 21a, 21b, and 21c can be selectively provided to PCM RF switches 6a, 6b, and 6c through voltage pulse enable transistors 43a, 43b, and 43c located in ASIC 5.

The flowchart continues at action 62 by using the ASIC to generate initial data for determining OFF state conductivity skew of the PCM for each PCM RF switch. A test current can be generated by a current source located in ASIC 5, such as current source 48 in FIG. 8A. The test current is provided to PCM contacts of PCM RF switches 6a, 6b, and 6c, such as PCM contacts 15a, 15b, and 15c in FIG. 8A. The test current can be selectively provided to PCM RF switches 6a, 6b, and 6c through test current enable transistors 46a, 46b, and 46c located in ASIC 5. A differential amplifier located in ASIC 5, such as differential amplifier 50, outputs signals proportional to voltage differences between PCM contacts 15a and 16a, PCM contacts 15b and 16b, and PCM contacts 15c and 16c. Thus, circuit 54 generates initial data for determining OFF state conductivity skew of PCMs 12a, 12b, and 12c.

The flowchart continues at action 63 by using the ASIC to perform a plurality of OFF/ON cycles. Pulsers 38 and 39 and voltage pulse enable transistors 43a, 43b, and 43c alternately provide amorphizing electrical pulses and crystallizing electrical pulses to PCM RF switches 6a, 6b, and 6c to perform an OFF/ON cycle. OFF/ON cycles are performed so that PCMs 12a, 12b, and 12c are repeatedly exposed to a significant number of amorphizing and crystallizing heat pulses and exhibit detectable conductivity skew. In one implementation, one million (1,000,000) OFF/ON cycles are performed.

The flowchart continues at action 64 by using the ASIC to provide amorphizing electrical pulses to the PCM RF switches. Action 64 is similar to action 61, except that action 64 occurs later in time. Action 64 ensures active segments of PCMs 12a, 12b, and 12c are in amorphous phases when data for determining OFF state conductivity skew is generated in a subsequent action.

The flowchart continues at action 65 by using the ASIC to generate comparison data for determining OFF state conductivity skew of the PCM for each PCM RF switch. Action 65 is similar to action 62, except that action 65 occurs later in time. Action 65 generates comparison data for determining OFF state conductivity skew, which can be compared against initial data for determining OFF state conductivity skew, for example, using an ATE, in order to quantify OFF state conductivity skew.

The flowchart continues at action 66 by using the ASIC to store the data, or provide the data to an external probe. Both initial data and comparison data for determining OFF state conductivity skew can be stored using buffer 52 located in ASIC 5. Both initial data and comparison data for determining OFF state conductivity skew can be provided to an external probe by reading out from buffer 52 using read out bus 53 located in ASIC 5. The external probe may be coupled to an ATE for receiving and analyzing test data generated by ROIC 2. In one implementation, ASIC 5 may read out data for determining OFF state conductivity skew each time it is generated. In another implementation, ASIC 5 may read out data for determining OFF state conductivity skew after a fixed number of cycles. In yet another implementation, ASIC 5 may read out data for determining OFF state conductivity skew whenever buffer 52 reaches a storage limit, after which buffer 52 can be reset.

The flowchart concludes at action 67 by continuing the testing method. Action 67 can encompass various actions such as providing crystallizing electrical pulses to the PCM RF switches, determining if any PCMs experienced significant OFF state conductivity skew, analyzing test data generated by the ROIC using the ATE, etc.

Figure 8D:
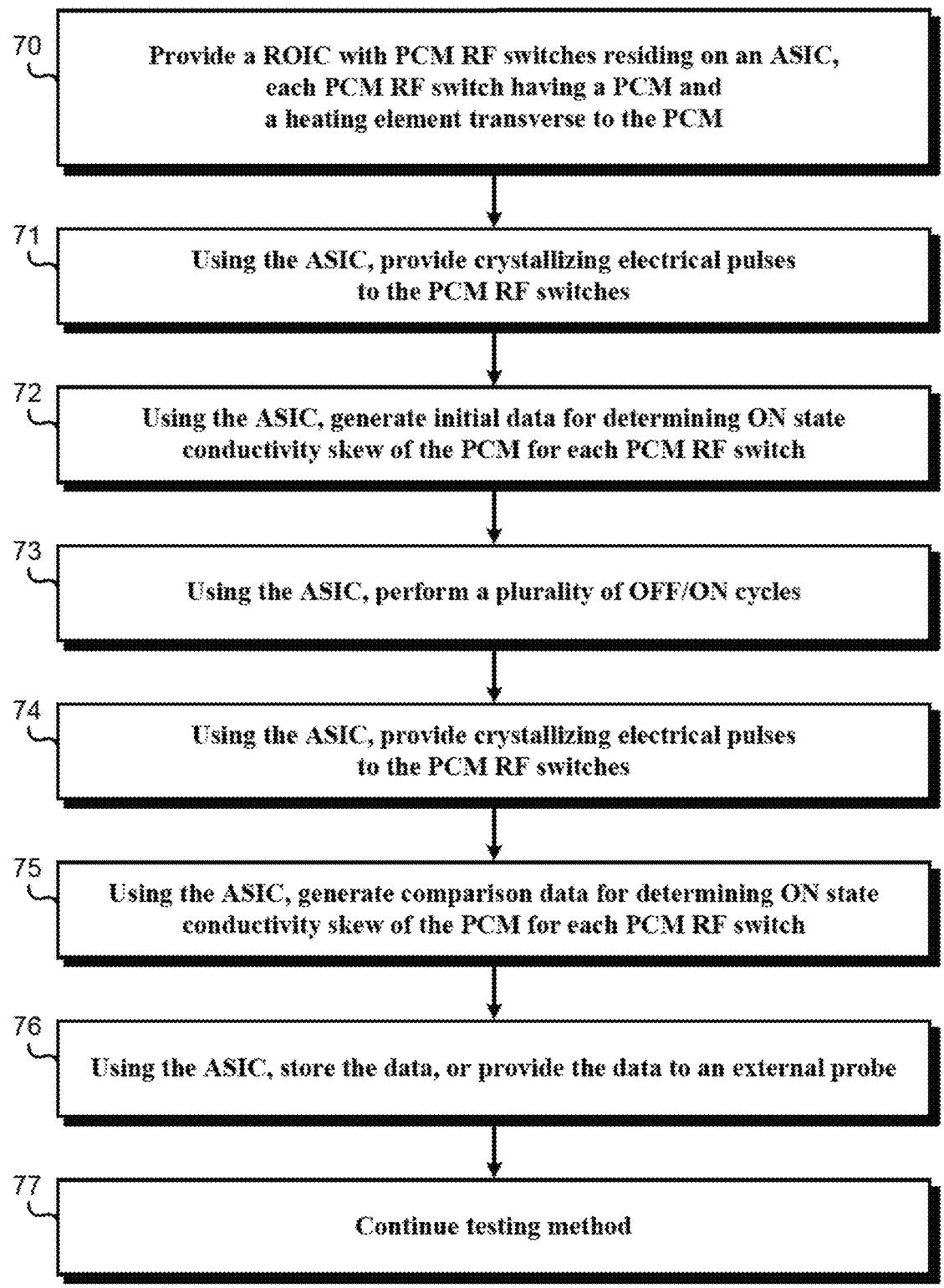
FIG. 8D illustrates a portion of a flowchart of an exemplary method for rapidly testing conductivity skew of PCM according to one implementation of the present application.

FIG. 8D illustrates a portion of a flowchart of an exemplary method for rapidly testing conductivity skew of PCMs according to one implementation of the present application. Actions 70 through 77 shown in the flowchart of FIG. 8D are sufficient to describe one implementation of the present inventive concepts. Other implementations of the present inventive concepts may utilize actions different from those shown in the flowchart of FIG. 8D. Certain details and features have been left out of the flowchart that are apparent to a person of ordinary skill in the art. For example, an action may consist of one or more sub-actions or may involve specialized equipment or materials, as known in the art. Moreover, some actions are omitted so as not to distract from the illustrated actions.

The flowchart begins at action 70 by providing a ROIC with PCM RF switches residing on an ASIC, each PCM RF switch having a PCM and a heating element transverse to the PCM. The ROIC and ASIC can correspond to ROIC 2 and ASIC 5 in FIG. 2. The PCM RF switches can correspond to PCM RF switches 6a, 6b, and 6c in FIG. 8A.

The flowchart continues at action 71 by using the ASIC to provide crystallizing electrical pulses to the PCM RF switches. The crystallizing electrical pulses can correspond to crystallizing electrical pulses 19a, 19b, and 19c in FIG. 8B. The crystallizing electrical pulses 19a, 19b, and 19c can be generated by a pulser located in ASIC 5, such as pulser 39 in FIG. 8A. Crystallizing electrical pulses 19a, 19b, and 19c are provided to heater contacts of PCM RF switches 6a, 6b, and 6c, such as heater contacts 18a, 18b, and 18c in FIG. 8A. Crystallizing electrical pulses 19a, 19b, and 19c can be selectively provided to PCM RF switches 6a, 6b, and 6c through voltage pulse enable transistors 43a, 43b, and 43c located in ASIC 5.

The flowchart continues at action 72 by using the ASIC to generate initial data for determining ON state conductivity skew of the PCM for each PCM RF switch. A test current can be generated by a current source located in ASIC 5, such as current source 48 in FIG. 8A. The test current is provided to PCM contacts of PCM RF switches 6a, 6b, and 6c, such as PCM contacts 15a, 15b, and 15c in FIG. 8A. The test current can be selectively provided to PCM RF switches 6a, 6b, and 6c through test current enable transistors 46a, 46b, and 46c located in ASIC 5. A differential amplifier located in ASIC 5, such as differential amplifier 50, outputs signals proportional to voltage differences between PCM contacts 15a and 16a, PCM contacts 15b and 16b, and PCM contacts 15c and 16c. Thus, circuit 54 generates initial data for determining ON state conductivity skew of PCMs 12a, 12b, and 12c.

The flowchart continues at action 73 by using the ASIC to perform a plurality of OFF/ON cycles. Pulsers 38 and 39 and voltage pulse enable transistors 43a, 43b, and 43c alternately provide amorphizing electrical pulses and crystallizing electrical pulses to PCM RF switches 6a. 6b, and 6c to perform an OFF/ON cycle. OFF/ON cycles are performed so that PCMs 12a. 12b, and 12c are repeatedly exposed to a significant number of amorphizing and crystallizing heat pulses and exhibit detectable conductivity skew. In one implementation, one million (1,000,000) OFF/ON cycles are performed.

The flowchart continues at action 74 by using the ASIC to provide crystallizing electrical pulses to the PCM RF switches. Action 74 is similar to action 71, except that action 74 occurs later in time. Action 74 ensures active segments of PCMs 12a, 12b, and 12c are in crystalline phases when data for determining ON state conductivity skew is generated in a subsequent action.

The flowchart continues at action 75 by using the ASIC to generate comparison data for determining ON state conductivity skew of the PCM for each PCM RF switch. Action 75 is similar to action 72, except that action 75 occurs later in time. Action 74 generates comparison data for determining ON state conductivity skew, which can be compared against initial data for determining ON state conductivity skew, for example, using an ATE, in order to quantify ON state conductivity skew.

The flowchart continues at action 76 by using the ASIC to store the data, or provide the data to an external probe. Both initial data and comparison data for determining ON state conductivity skew can be stored using buffer 52 located in ASIC 5. Both initial data and comparison data for determining ON state conductivity skew can be provided to an external probe by reading out from buffer 52 using read out bus 53 located in ASIC 5. The external probe may be coupled to an ATE for receiving and analyzing test data generated by ROIC 2. In one implementation, ASIC 5 may read out data for determining ON state conductivity skew each time it is generated. In another implementation, ASIC 5 may read out data for determining ON state conductivity skew after a fixed number of cycles. In yet another implementation, ASIC 5 may read out data for determining ON state conductivity skew whenever buffer 52 reaches a storage limit, after which buffer 52 can be reset.

The flowchart concludes at action 77 by continuing the testing method. Action 77 can encompass various actions such as providing amorphizing electrical pulses to the PCM RF switches, determining if any PCMs experienced significant ON state conductivity skew, analyzing test data generated by the ROIC using the ATE, etc.

Rapid testing ROICs according to the present invention are able to provide several advantages. First, because PCM RF switches 6 (shown in FIG. 3) reside on ASIC 5 (shown in FIG. 2), PCM RF switches 6 are integrated on the same chip as circuitry for programming and testing the PCM RF switches 6. Contact pads 4 (shown in FIG. 2) do not have to be used for receiving electrical pulses and test currents from external probes, and more contact pads 4 can be dedicated to reading out data generated by ROIC 4. Multiple contact pads 4 are also not required for each PCM RF switch 6, avoiding complexities in layout and fabrication. The proximity of PCM RF switches 6 and ASIC 5 also allows for connections with reduced contact resistances. Reduced contact resistances reduce power loss and increase the accuracy of conductivity skew detection, particularly because long cables are not used to provide test currents, and their impedances do not need to be accounted for when extrapolating the conductivity of PCM from the output of differential amplifier 50 (shown in FIG. 8A).

Second, because ROIC 2 includes voltage pulse enable transistors 43a, 43b, and 43c (shown in FIG. 8A) that provide amorphizing and crystallizing electrical pulses from pulser line 42 to selected PCM RF switches 6a, 6b, and 6c, ROIC 2 reduces testing time delays associated with PCM temperature and phase stabilization. Controller 37 can synchronize voltage pulse enable control bus 44 with the periods of electrical pulses at pulser line 42 such that each of voltage pulse enable transistors 43a, 43b, and 43c is only turned on for the duration of one electrical pulse. For example, voltage pulse enable transistor 43a can provide an electrical pulse to PCM RF switch 6a, then voltage pulse enable transistor 43b can immediately provide another electrical pulse to PCM RF switch 6b at the beginning of the next pulse period, and then voltage pulse enable transistor 43c can immediately provide another electrical pulse to PCM RF switch 6c at the beginning of the next pulse period. It is not necessary to wait for the PCM of a PCM RF switch to cool and stabilize before providing the next electrical pulse. In one implementation, this avoids delays of approximately ten microseconds (10 μs) or more between each subsequent electrical pulse.

Third, because ROIC 2 includes two pulsers 38 and 39 and regulator 40 (shown in FIG. 8A), ROIC 2 can reliably provide amorphizing and crystallizing electrical pulses to PCM RF switches 6a, 6b, and 6c. Using a single programmable pulser generally cannot provide an amplitude range and a pulse width range to generate both amorphizing and crystallizing electrical pulses without significant performance tradeoffs, such as loss of accuracy, longer rise/fall times, and longer minimum periods. In ROIC 2, pulser 38 can be dedicated to generating amorphizing electrical pulses having higher amplitude and narrower pulse width, while pulser 39 can be dedicated to generating crystallizing electrical pulses having lower amplitude and wider pulse width.

Fourth, ROIC 2 flexibly generates data for determining conductivity skew. Because each of PCM RF switches 6a, 6b, and 6c (shown in FIG. 8A) can selectively couple to current source 48 through corresponding test current enable transistors 46a, 46b, and 46c, and because each pair of PCM contacts 15a and 16a, 15b and 16b, and 15c and 16c can selectively transfer voltages to differential amplifier through MUX 49. ROIC 2 supports degrees of control when testing numerous PCM RF switches. For example, data for determining conductivity skew of PCM 12a, 12b, and 12c can be generated after ROIC 2 performs one OFF/ON cycle, after ROIC 2 performs one thousand OFF/ON cycles, or after ROIC 2 performs one million OFF/ON cycles. Data for determining conductivity skew can be generated for all of PCMs 12a, 12b, and 12c, or for only a select group of PCMs 12a, 12b, and 12c. Redundant data can be generated for PCMs 12a, 12b, and 12c to eliminate noise and other random test errors. Moreover. ROIC 2 can generate data for determining both ON state conductivity skew and OFF state conductivity skew of PCMs 12a, 12b, and 12c.

Fifth and finally, ROIC 2 enables generation of a statistically significant set of non-simulated test data at rapid speeds. ROIC 2 can perform enough OFF/ON cycles for PCM 12 (shown in FIG. 4) to exhibit detectable conductivity skew. ROIC 2 can test enough PCM RF switches 6 to confidently determine the average OFF state and ON state conductivity skews and the variances in OFF state and ON state conductivity skews for a given PCM RF switch design. In one implementation, the total time required for ROIC 2 to cycle twenty thousand (20,000) PCM RF switches 6 one million (1,000,000) OFF/ON cycles each, generate data for determining OFF state conductivity skew and ON state conductivity skew for each PCM 12 in the PCM RF switches 6, and read out the data can be approximately fifty three minutes (53 min). Testing through these many cycles using conventional means, for example, by connecting external probes of an ATE to an individual PCM RF switch at a time, could take more than fifty years. Thus, ROIC 2 enables rapid testing that is several orders of magnitude faster than conventional means.

Thus, various implementations of the present application achieve a rapid testing ROIC, and utilize the inventive ASIC of the present application, to overcome the deficiencies in the art to significantly reduce test delays, increase test accuracy, and generate large sets of test data for determining and characterizing conductivity skew of PCM in PCM RF switches accurately and rapidly. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A rapid testing read out integrated circuit (ROIC) comprising:
   phase-change material (PCM) radio frequency (RF) switches residing on an application specific integrated circuit (ASIC);
   each said PCM RF switch comprising a PCM and a heating element transverse to said PCM;
   said ASIC configured to provide amorphizing and crystallizing electrical pulses to a selected PCM RF switch;
   said ASIC configured to generate data for determining OFF state conductivity skew and ON state conductivity skew of said PCM in said selected PCM RF switch after said ASIC performs a plurality of OFF/ON cycles.

2. The rapid testing ROIC of claim 1, wherein said ASIC generates said data for determining OFF state conductivity skew of said PCM in response to said amorphizing electrical pulse, and generates said data for determining ON state conductivity skew of said PCM in response to said crystallizing electrical pulse.

3. The rapid testing ROIC of claim 1, wherein said data for determining OFF state conductivity skew of said PCM and said data for determining ON state conductivity skew of said PCM each correspond to a voltage difference between first and second PCM contacts of said selected PCM RF switch.

4. The rapid testing ROIC of claim 1, wherein said ROIC is configured to store said data for determining OFF state conductivity skew of said PCM and said data for determining ON state conductivity skew of said PCM in said ASIC.

5. The rapid testing ROIC of claim 1, wherein said ROIC is configured to provide said data for determining OFF state conductivity skew of said PCM and said data for determining ON state conductivity skew of said PCM to an external probe.

6. The rapid testing ROIC of claim 5, wherein said external probe is coupled to an automatic test equipment (ATE).

7. The rapid testing ROIC of claim 1, wherein said ASIC is configured to provide one of said amorphizing and crystallizing electrical pulses at a time.

8. The rapid testing ROIC of claim 1, wherein said ASIC comprises voltage pulse enable transistors configured to select said selected PCM RF switch.

9. A rapid testing read out integrated circuit (ROIC) comprising:
   phase-change material (PCM) radio frequency (RF) switches residing on an application specific integrated circuit (ASIC);
   each said PCM RF switch comprising a PCM and a heating element transverse to said PCM;
   said ASIC configured to provide amorphizing and crystallizing electrical pulses to a selected PCM RF switch, wherein a first heater contact of said selected PCM RF switch is coupled to a pulser through a voltage pulse enable transistor;
   said ASIC configured to generate data for determining OFF state conductivity skew and ON state conductivity skew of said PCM in said selected PCM RF switch after said ASIC performs a plurality of OFF/ON cycles, wherein a first PCM contact of said selected PCM RF switch is coupled to a current source through a test current enable transistor.

10. The rapid testing ROIC of claim 9, wherein a second heater contact and a second PCM contact of said selected PCM RF switch are coupled to ground.

11. The rapid testing ROIC of claim 9, wherein said current source is configured to provide a first test current in response to said amorphizing electrical pulse, and provide a second test current in response to said crystallizing electrical pulse.

12. The rapid testing ROIC of claim 9, wherein said ASIC generates said data for determining OFF state conductivity skew of said PCM in response to said amorphizing electrical pulse, and generates said data for determining ON state conductivity skew of said PCM in response to said crystallizing electrical pulse.

13. The rapid testing ROIC of claim 9, wherein said data for determining OFF state conductivity skew of said PCM and said data for determining ON state conductivity skew of said PCM each correspond to a voltage difference between said first PCM contact and a second PCM contact of said selected PCM RF switch.

14. The rapid testing ROIC of claim 9, wherein said ROIC is configured to store said data for determining OFF state conductivity skew of said PCM and said data for determining ON state conductivity skew of said PCM in said ASIC.

15. The rapid testing ROIC of claim 9, wherein said ROIC is configured to provide said data for determining OFF state conductivity skew of said PCM and said data for determining ON state conductivity skew of said PCM to an external probe.

16. The rapid testing ROIC of claim 15, wherein said external probe is coupled to an automatic test equipment (ATE).

17. A read out integrated circuit (ROIC) comprising:
phase-change material (PCM) radio frequency (RF) switches and an application specific integrated circuit (ASIC);
each said PCM RF switch comprising a PCM and a heating element;
said ASIC configured to provide amorphizing and/or crystallizing electrical pulses to a selected PCM RF switch;
said ASIC configured to generate data for determining OFF state conductivity skew and/or ON state conductivity skew in said selected PCM RF switch.

18. The ROIC of claim 17, wherein said ROIC is configured to store said data for determining OFF state conductivity skew in said selected PCM RF switch and said data for determining ON state conductivity skew in said selected PCM RF switch in said ASIC.

19. The ROIC of claim 17, wherein said ROIC is configured to provide said data for determining OFF state conductivity skew in said selected PCM RF and said data for determining ON state conductivity skew in said selected PCM RF to an external probe.

20. The ROIC of claim 19, wherein said external probe is coupled to an automatic test equipment (ATE).

* * * * *